United States Patent
Wang

(10) Patent No.: US 8,551,836 B2
(45) Date of Patent: Oct. 8, 2013

(54) SEMICONDUCTOR DEVICE AND METHOD OF MANUFACTURING THE SAME

(75) Inventor: Wensheng Wang, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 37 days.

(21) Appl. No.: 13/108,370

(22) Filed: May 16, 2011

(65) Prior Publication Data

US 2012/0032299 A1 Feb. 9, 2012

(30) Foreign Application Priority Data

Aug. 6, 2010 (JP) ................................. 2010-177464

(51) Int. Cl.
*H01L 21/8242* (2006.01)

(52) U.S. Cl.
USPC ........ 438/239; 438/3; 438/700; 257/E21.006; 257/E21.008; 257/E21.058; 257/E21.077; 257/E21.165; 257/E21.229; 257/E21.231; 257/E21.245; 257/E21.253

(58) Field of Classification Search
USPC ............. 438/239, 238, 353, 3, 270, 680, 692, 438/700, 688, 789, 721, 755, 745, 683, 684, 438/663; 257/E21.006, E21.008, E21.026, 257/E21.058, E21.077, E21.165, E21.169, 257/E21.229, E21.231, E21.245, E21.332
See application file for complete search history.

(56) References Cited

U.S. PATENT DOCUMENTS

| | | | |
|---|---|---|---|
| 6,673,672 B2 * | 1/2004 | Sashida | 438/253 |
| 6,740,531 B2 * | 5/2004 | Cho et al. | 438/3 |
| 6,809,360 B2 * | 10/2004 | Kato | 257/295 |
| 7,547,558 B2 * | 6/2009 | Okita et al. | 438/3 |
| 7,573,084 B2 * | 8/2009 | Kumura et al. | 257/295 |
| 2005/0136554 A1 | 6/2005 | Okita et al. | |
| 2005/0255663 A1 | 11/2005 | Natori et al. | |
| 2008/0073682 A1 | 3/2008 | Kumura et al. | |

FOREIGN PATENT DOCUMENTS

| | | |
|---|---|---|
| JP | 2005-183843 A | 7/2005 |
| JP | 2005-327847 A | 11/2005 |
| JP | 2008-084880 A | 4/2008 |
| JP | 2009-105084 A | 5/2009 |

* cited by examiner

*Primary Examiner* — David Nhu
(74) *Attorney, Agent, or Firm* — Westerman, Hattori, Daniels & Adrian, LLP

(57) ABSTRACT

A method of manufacturing a semiconductor device includes forming an insulating film over a semiconductor substrate, forming a capacitor including a lower electrode, a capacitor dielectric film including a ferroelectric material, and an upper electrode over the insulating film, forming a first protective insulating film over a side surface and upper surface of the capacitor by a sputtering method, and forming a second protective insulating film over the first protective insulating film by an atomic layer deposition method.

18 Claims, 29 Drawing Sheets

FIG. 4

| | First Protective Insulating Film 40 | Second Protective Insulating Film 43 | Anneal (FIG. 3M) | Third Protective Insulating Film 44 | Anneal (FIG. 3O) | Anneal (FIG. 3P) |
|---|---|---|---|---|---|---|
| Comparative Example | Sputter 50nm | Sputter 20nm | 650°C | None | None | None |
| Embodiment (1) | Sputter 50nm | Sputter 10nm | 650°C | ALD 20nm | 500°C, 30minutes | None |
| Embodiment (2) | Sputter 50nm | Sputter 15nm | 650°C | ALD 20nm | 500°C, 30minutes | None |
| Embodiment (3) | Sputter 50nm | Sputter 20nm | 650°C | ALD 20nm | 500°C, 30minutes | None |

FIG. 5

| | First Protective Insulating Film 40 | Third Protective Insulating Film 43 | Anneal (FIG. 3M) | Third Protective Insulating Film 44 | Anneal (FIG. 3O) | Anneal (FIG. 3P) |
|---|---|---|---|---|---|---|
| Embodiment (4) | Sputter 50nm | Sputter 20nm | 650°C | ALD 20nm | 500°C, 30 minutes | 550°C, 60 minutes |
| Embodiment (5) | Sputter 50nm | Sputter 20nm | 650°C | ALD 20nm | 500°C, 30 minutes | 650°C, 60 minutes |
| Reference Example (1) | Sputter 50nm | ALD 2nm | 650°C | ALD 20nm | 500°C, 30 minutes | None |
| Reference Example (2) | Sputter 50nm | ALD 2nm | 650°C | ALD 40nm | 500°C, 30 minutes | None |

US 8,551,836 B2

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2010-177464, filed on Aug. 6, 2010, the entire contents of which are incorporated herein by reference.

FIELD

It is related to a semiconductor device and a method of manufacturing the semiconductor device.

BACKGROUND

In addition to flash memories, ferroelectric memories such as FeRAM (Ferroelectric Random Access Memory) are well-known as nonvolatile memories capable of retaining stored information even after a power supply is turned off.

A ferroelectric memory includes a capacitor using a ferroelectric film as a capacitor dielectric film. Information is stored in the ferroelectric memory with the direction of the polarity of the ferroelectric film caused to correspond to "1" or "0". There is an advantage in that the ferroelectric memory is capable of operating at low power consumption and at high speed as compared with the flash memory.

In many cases, an oxide ferroelectric such as PZT (Lead Zirconium Titanate) is used as a material for the ferroelectric film.

However, the oxide ferroelectrics are easily reduced by a reductant such as water and hydrogen to greatly deteriorate ferroelectric characteristics such as a switching charge. To protect a capacitor from such a reductant, there is a proposed structure in which a capacitor is covered with a protection film such as an alumina film to prevent a reductant from intruding into the capacitor.

Note that the related techniques are disclosed in Japanese Laid-open Patent Publications No. 2005-183843, No. 2005-327847, No. 2008-84880, and No. 2009-105084.

SUMMARY

According to one aspect discussed herein, there is provided a method of manufacturing a semiconductor device including forming an insulating film over a semiconductor substrate, forming a capacitor including a lower electrode, a capacitor dielectric film including a ferroelectric material, and an upper electrode over the insulating film, forming a first protective insulating film over a side surface and upper surface of the capacitor by a sputtering method, and forming a second protective insulating film over the first protective insulating film by an atomic layer deposition method.

According to another aspect discussed herein, there is provided a semiconductor device including an insulating film formed over a semiconductor substrate, a capacitor formed over the insulating film and including a lower electrode, a capacitor dielectric film including a ferroelectric material and an upper electrode, a first protective insulating film made of alumina and formed over a side surface and upper surface of the capacitor, and a second protective insulating film made of alumina and formed over the first protective insulating film, wherein a density of the alumina in the first protective insulating film is smaller than a density of the alumina in the second protective insulating film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 4 is a set of schematic views (No. 1) illustrating a method of manufacturing samples;

FIG. 5 is a set of schematic views (No. 2) illustrating the method of manufacturing samples;

DESCRIPTION OF EMBODIMENTS

Prior to the description of the present embodiment, studies carried out by the inventor of this application are described.

An alumina film is formed sometimes as a protective film for protecting a ferroelectric capacitor from a reductant such as hydrogen. The alumina film is excellent in a capability of preventing intrusion of hydrogen. In contrast, there is still room for study on how the ferroelectric capacitor is influenced during formation of the alumina film.

The inventor of this application conducted the following studies to investigate influences of an alumina film on a ferroelectric capacitor.

Figure 1:
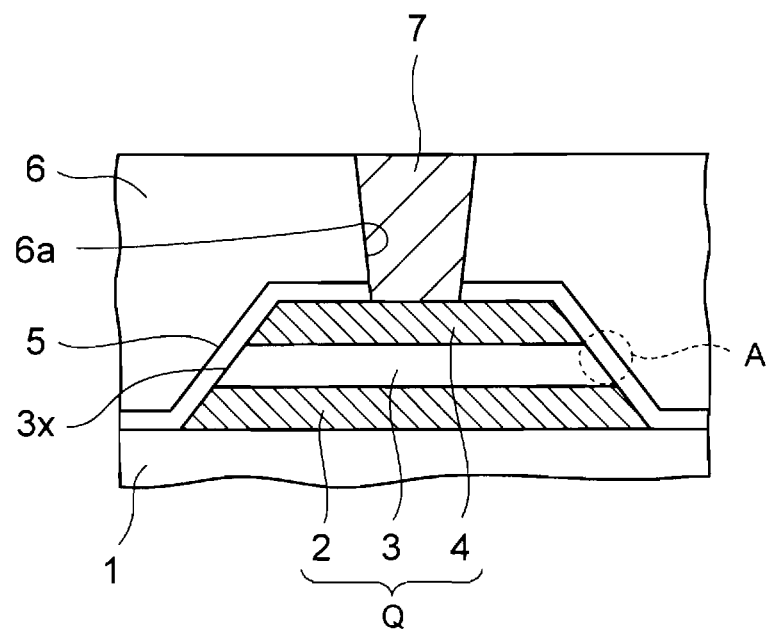
FIG. 1 is a cross-sectional view of a sample used in a study.

FIG. 1 is a cross-sectional view of a sample used in a study. This sample includes a ferroelectric capacitor Q which is formed by stacking a lower electrode 2, a PZT film 3, and an upper electrode 4 on an insulating film 1 such as a silicon oxide film.

The capacitor Q includes an alumina film 5 formed thereon for preventing a reductant such as hydrogen in an outer atmosphere from intruding into the PZT film 3.

A method of forming the alumina film 5 includes various film-forming methods. In this study, the alumina film 5 in an amorphous state is formed using an ALD (Atomic Layer Deposition) method which is excellent in its coverage on a side surface of the capacitor Q. With the AID method, the alumina film 5 can be formed to be thick on the side surface of the capacitor Q as compared with the case of using a sputtering method. Thus, the alumina film 5 is expected to successfully protect the side surface of the capacitor Q.

In addition, the alumina film 5 has thereon an interlayer insulating film 6, such as a silicon oxide film, with a hole 6a. The hole 6a has thereinside a conductive plug 7 containing tungsten. The conductive plug 7 electrically communicates the upper electrode 5 to an outside.

In this sample, the AID method is used for forming the alumina film 5, as described above. The AID method enables to form an alumina film 5 which is excellent in its coverage as compared with the sputtering method. Thus, even when a device is further miniaturized, it enables to form an alumina film 5 with a sufficient thickness on the side surface of a ferroelectric capacitor Q, and to maintain the capability of the alumina film 5, which prevents intrusion of a reductant.

Moreover, since the alumina film 5 is in an amorphous state, it has no clear grain boundary of alumina in the film. Therefore, it is less likely that a reductant such as hydrogen in the outer atmosphere intrudes into the alumina film 5 along the grain boundary. Thus, it is possible to obtain the alumina film 5 with excellent capability of preventing intrusion of a reductant.

Incidentally, in this sample, the alumina film formed by the ALD method comes into direct contact with a side surface 3x of the PZT film 3.

The inventor of this application observed the PZT film 3 in the dotted circle A in FIG. 1 with TEM (Transmission Electron Microscope) in order to investigate the structure of the PZT film near the side surface 3x.

Figure 2A:
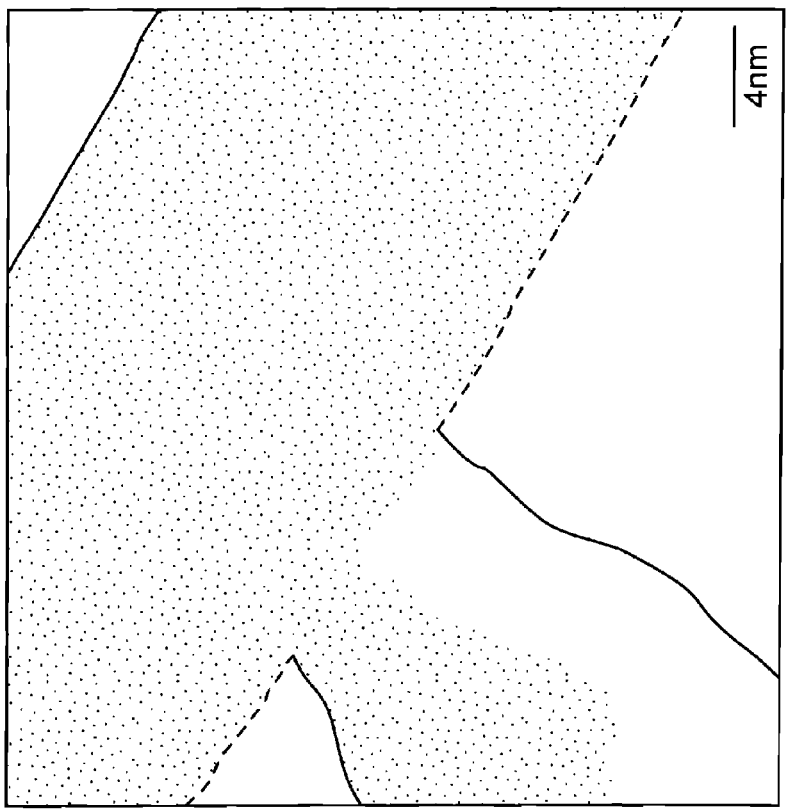
FIGS. 2A and 2B are views each being depicted based on a cross-sectional TEM image of a PZT film.
Figure 2B:
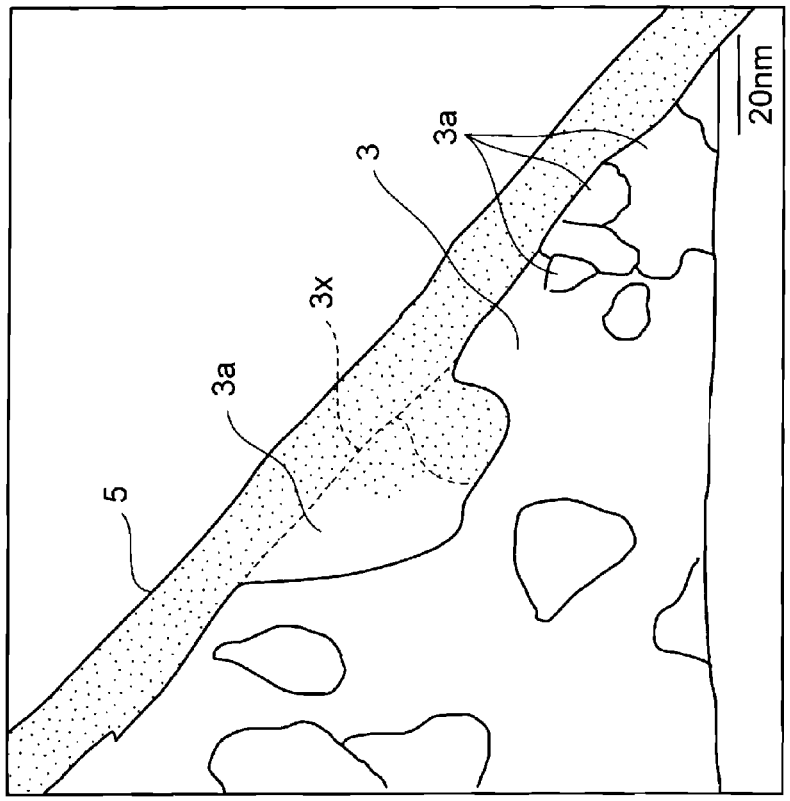

The result of the observation is illustrated in FIG. 2A, which is a view depicted based on a cross-sectional TEM image in the dotted circle A in FIG. 1. FIG. 2B is an enlarged view of FIG. 2A.

Note that, in this example, the alumina film 5 is formed with a thickness of 2 nm by the AID method and thereafter annealing is carried out on the capacitor.

As illustrated in FIG. 2A, many PZT crystal grains 3a are present in the PZT film 3. On the side surface 3x, the alumina film 5 intrudes into the PZT film 3 along the grain boundary of the PZT crystal grains 3a.

As the reason, it is considered that a film-forming gas used in the AID method intrudes into the grain boundary of the PZT crystal grains 3a. In particular, the ALD method is a method in which the alumina film 5 is formed by laminating alumina monoatomic layers. Thus, the ALD method tends to cause alumina atoms to easily intrude into tiny gaps between the adjacent PZT crystal grains. This tendency is not found in the sputtering method in which an alumina grain aggregate far larger than the alumina atoms is deposited to form the alumina film, and is considered to be characteristic of the ALD method.

However, in a portion where alumina intrudes into the PZT film 3 as described above, it is likely that the composition of the PZT vary from that in other portions to thereby cause deterioration of ferroelectric characteristics such as a switching charge. As a result, there is a possibility of causing deterioration of the electric characteristics of the ferroelectric capacitor Q to thus lower the reliability of a semiconductor device with the ferroelectric capacitor Q.

With a view to the aforementioned observation, the inventor of this application has been brought to the following embodiments.

(First Embodiment)

Figure 3A:
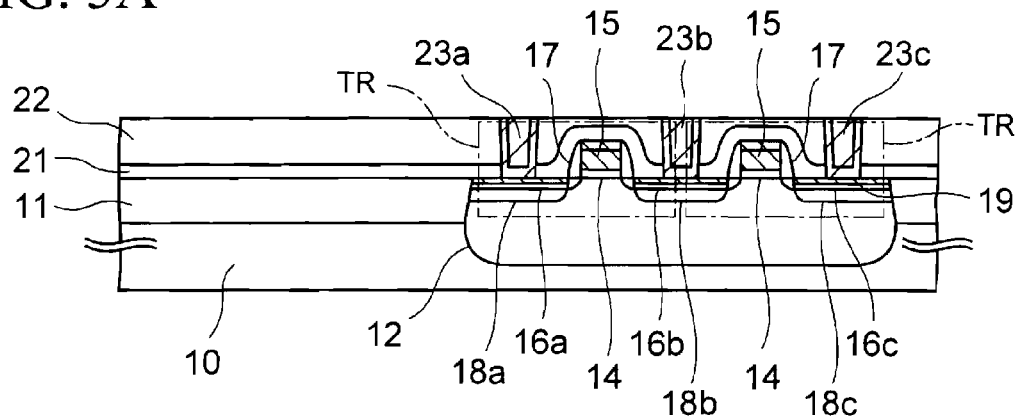
FIGS. 3A to 3T are cross-sectional views illustrating mid-processes of manufacturing a semiconductor device according to a first embodiment.
Figure 3B:
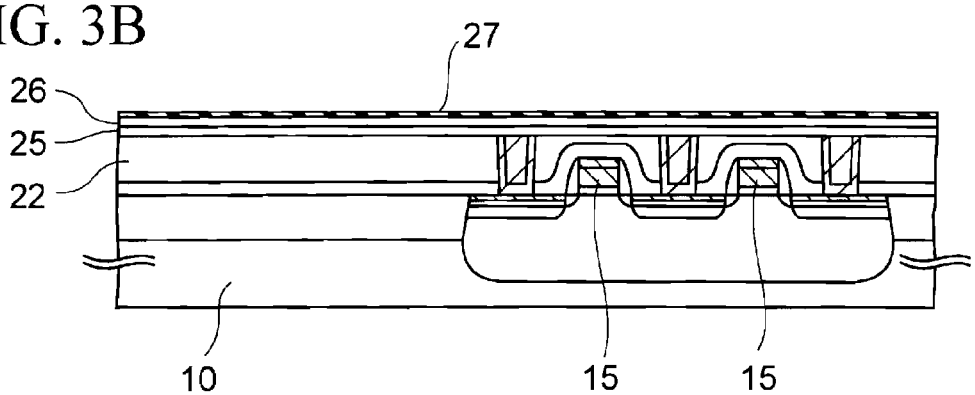
Figure 3C:
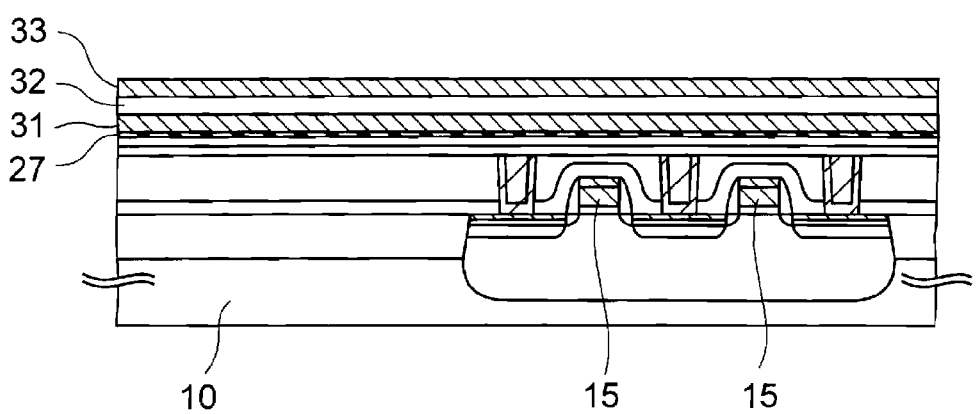
Figure 3D:
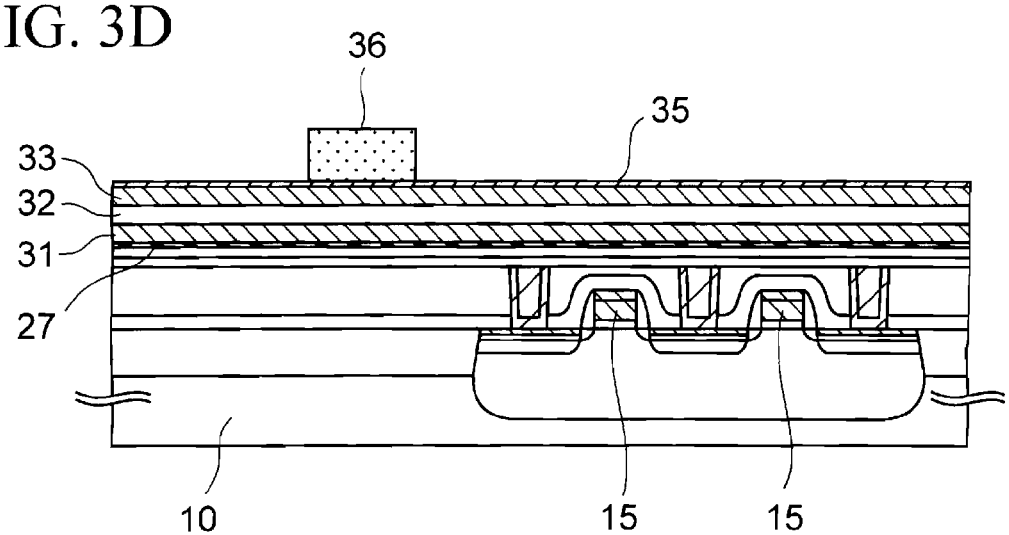
Figure 3E:
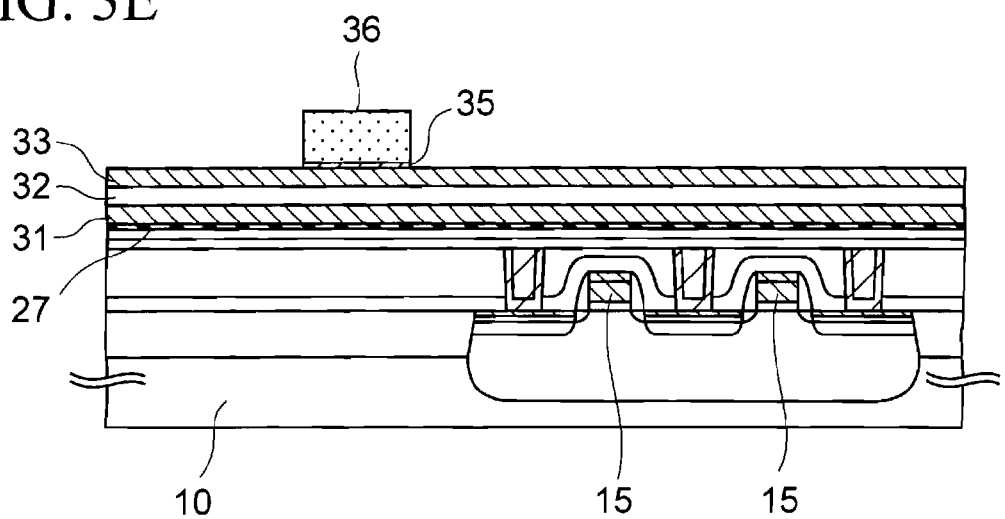
Figure 3F:
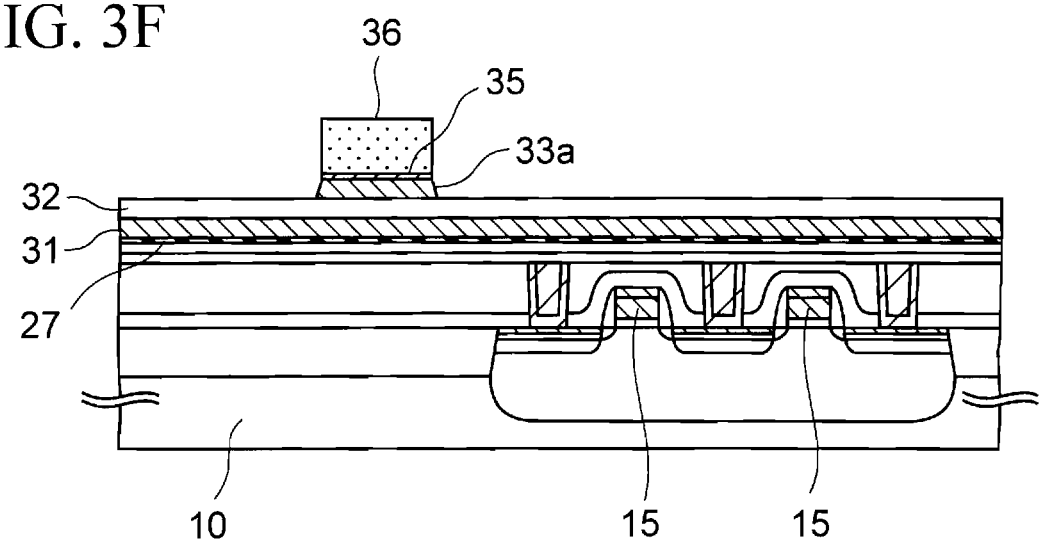
Figure 3G:
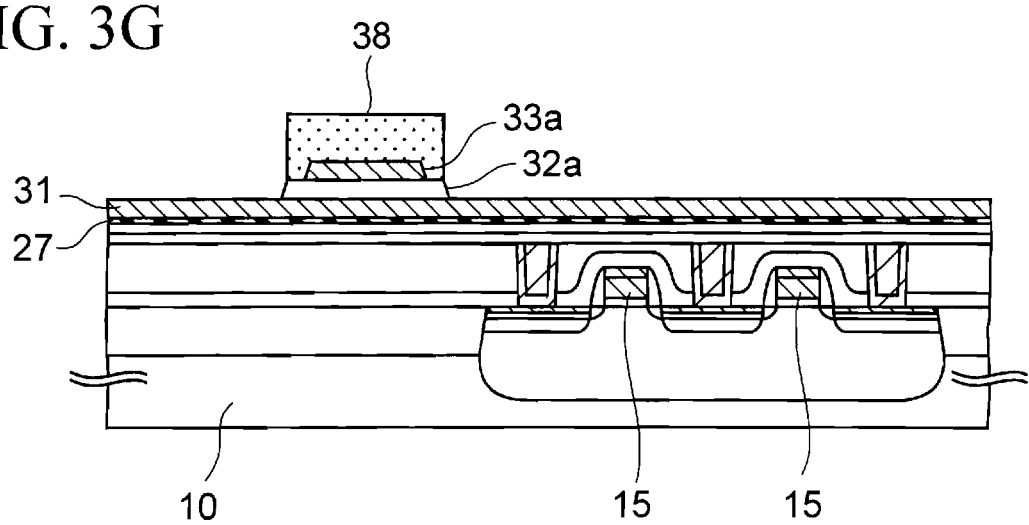
Figure 3H:
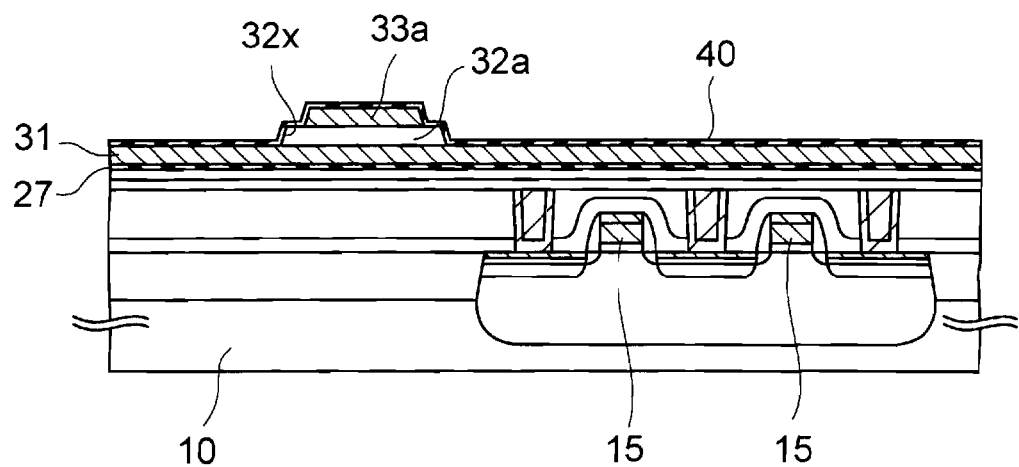
Figure 3I:
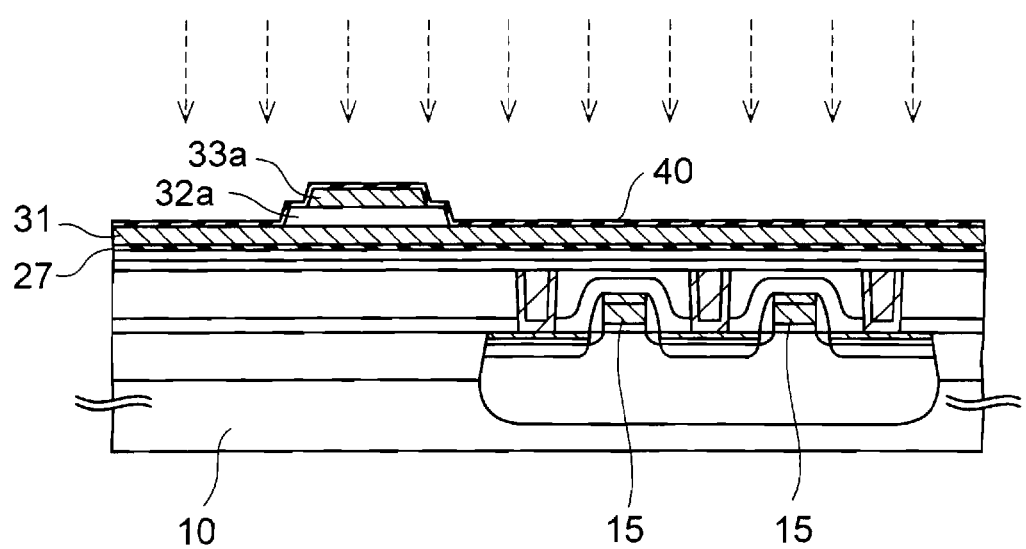
Figure 3J:
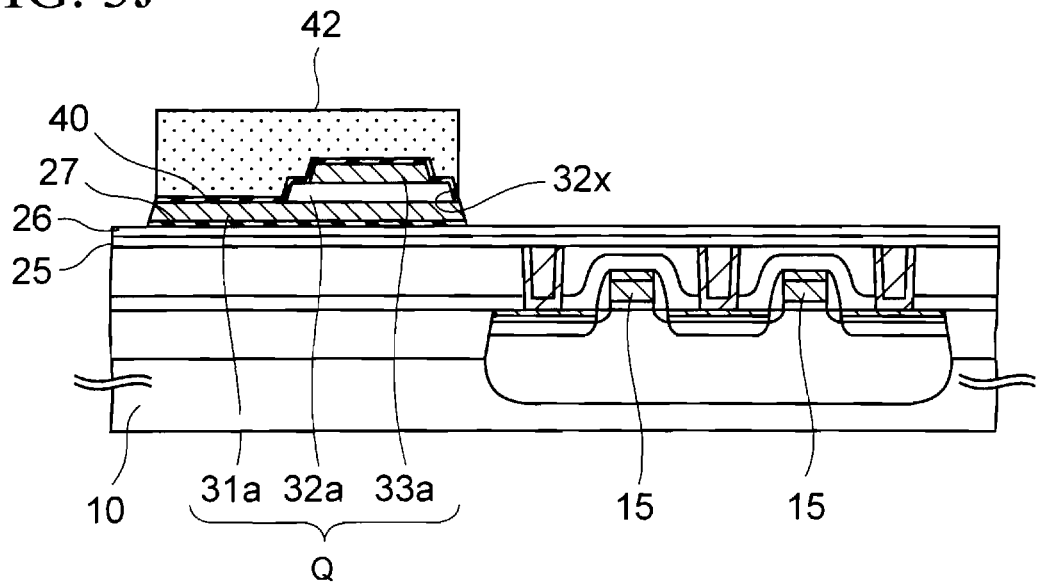
Figure 3K:
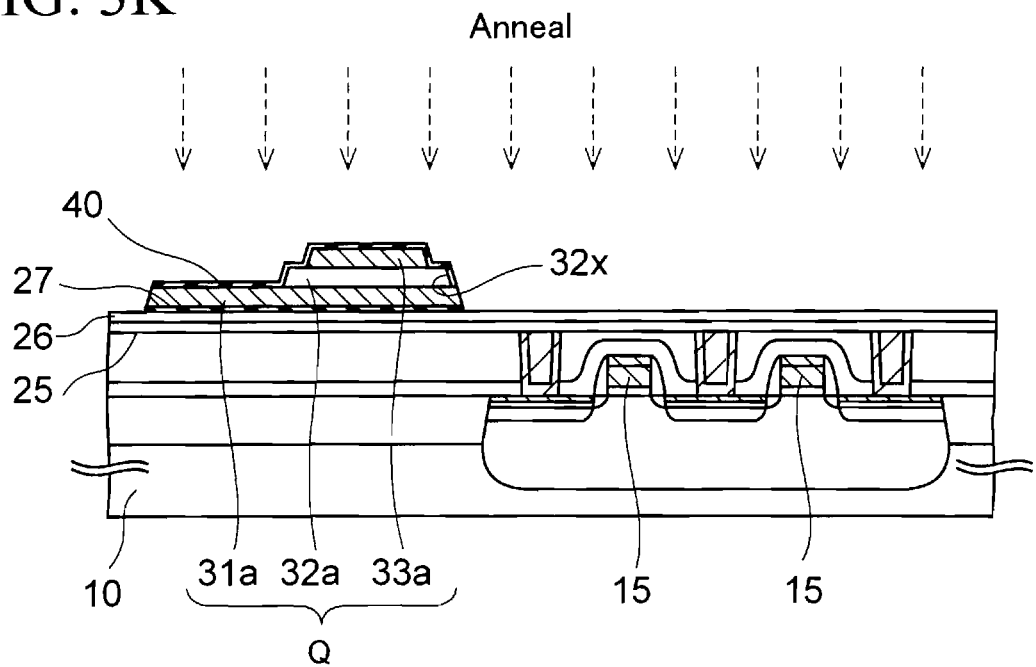
Figure 3L:
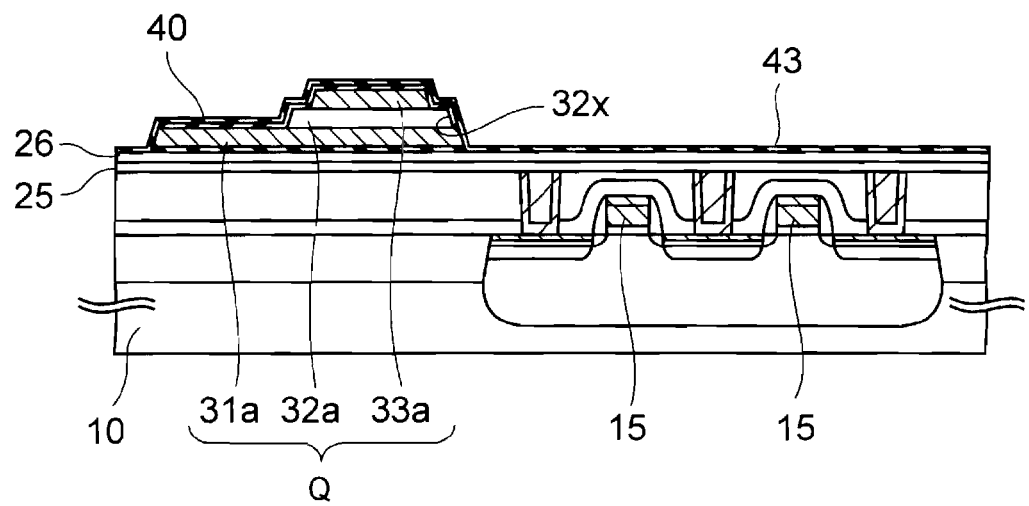
Figure 3M:
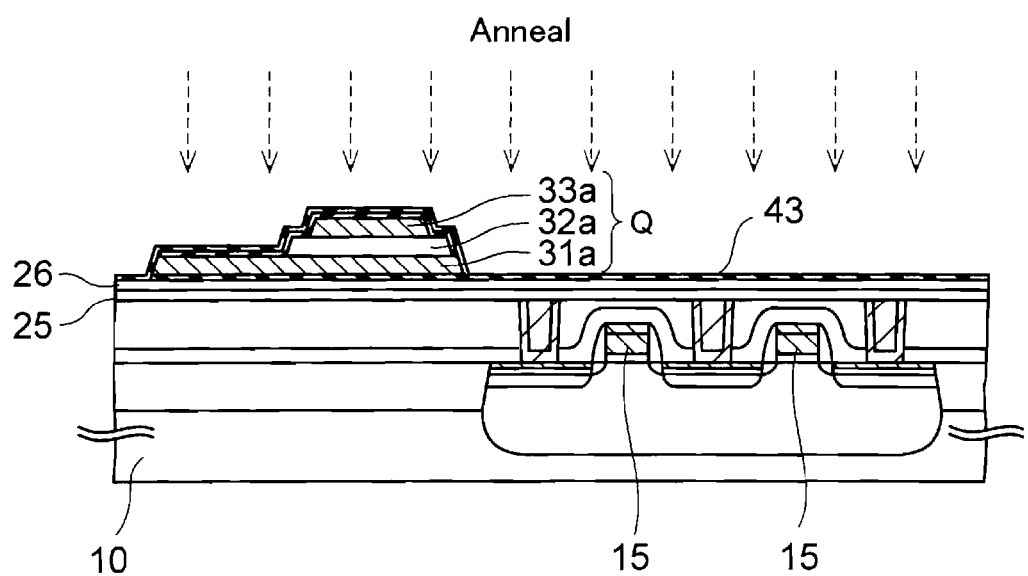
Figure 3N:
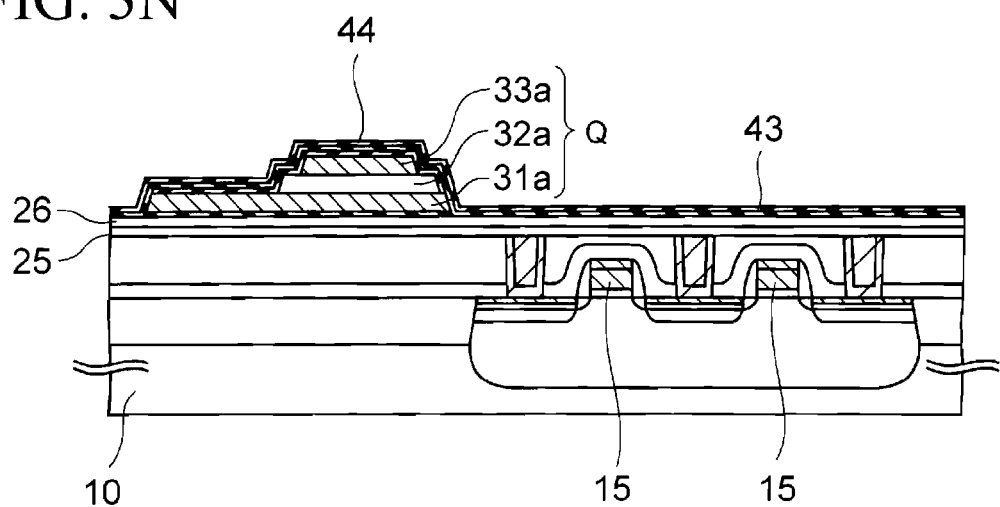
Figure 3O:
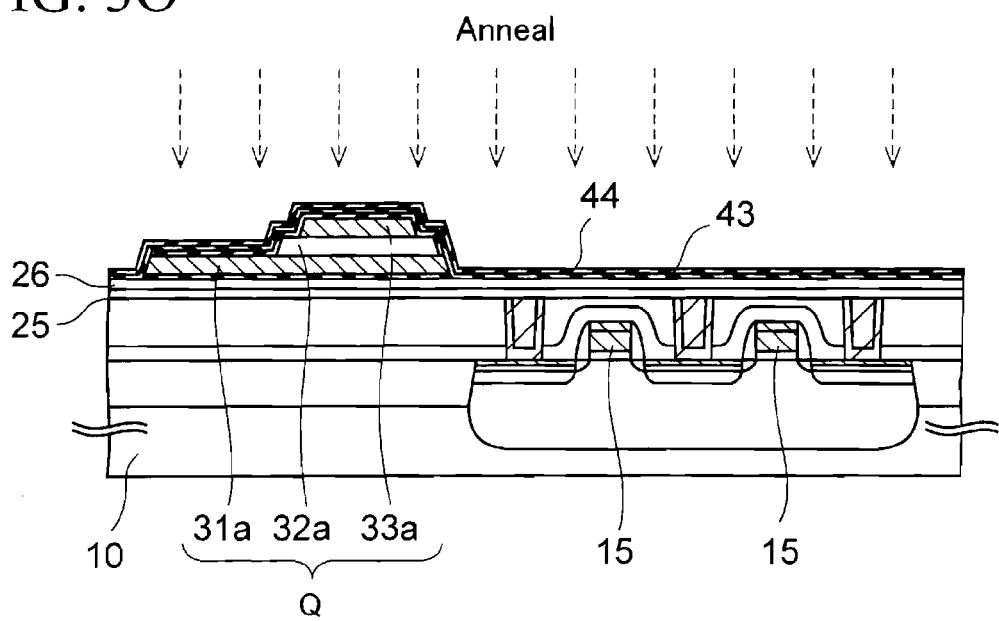
Figure 3P:
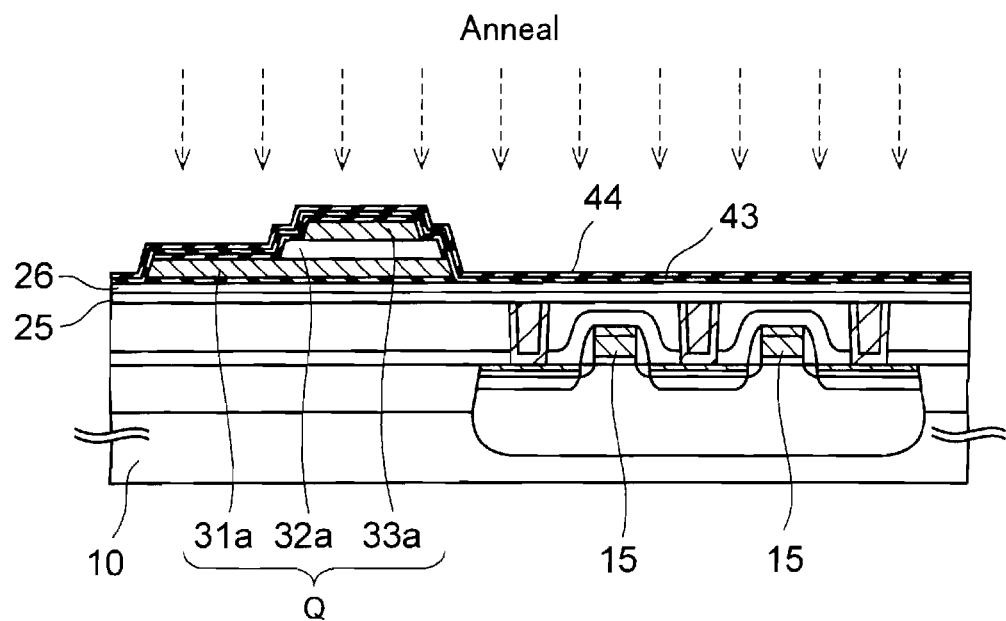
Figure 3Q:
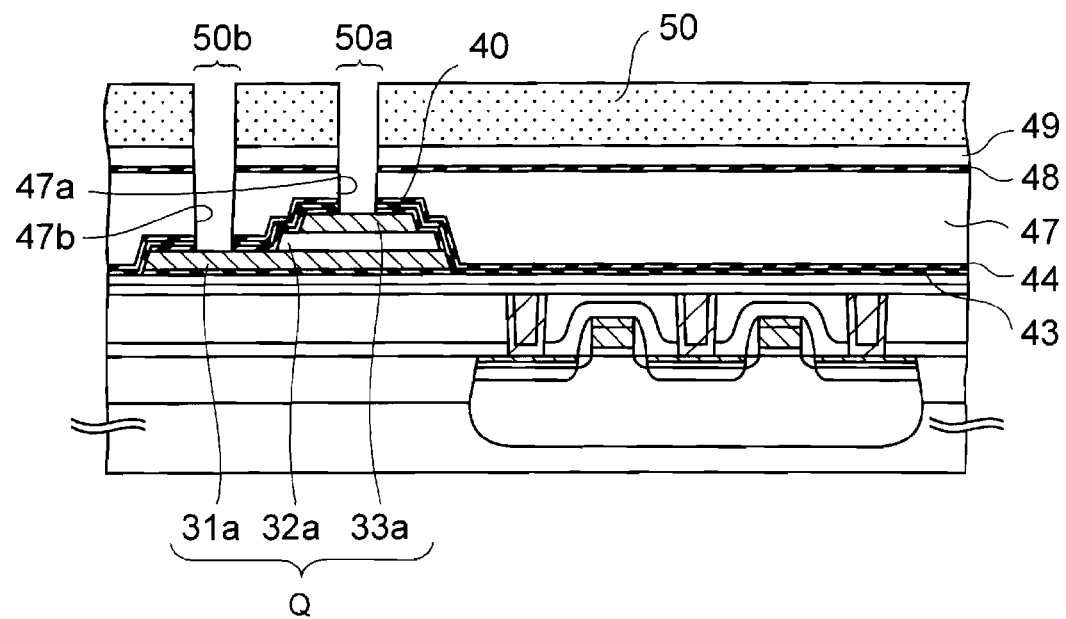
Figure 3R:
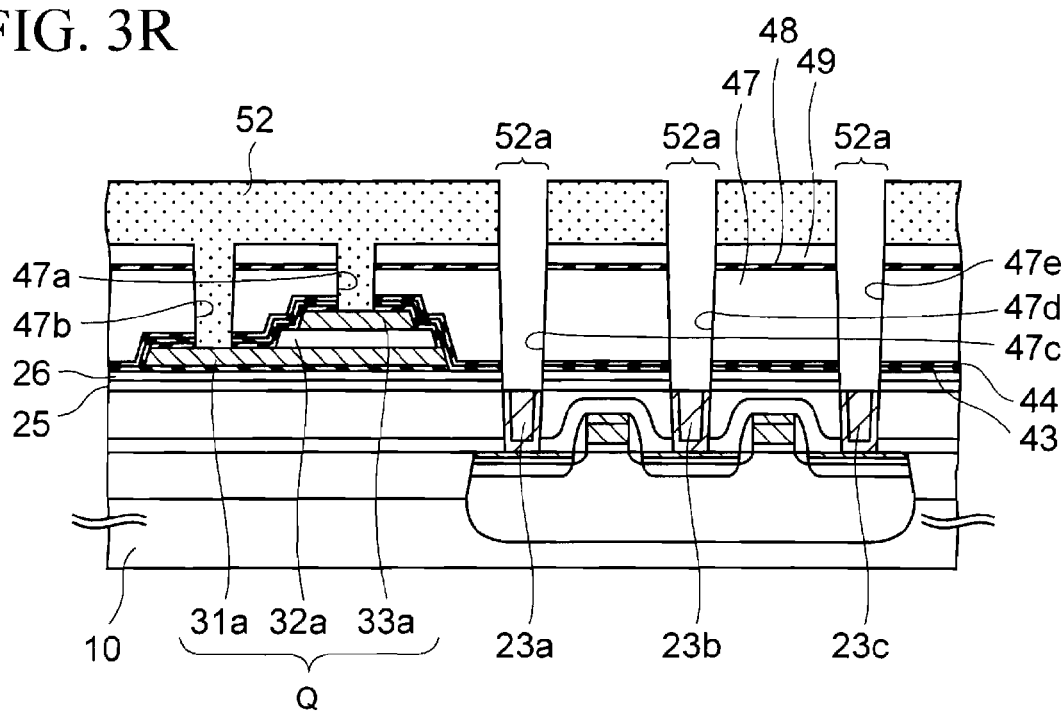
Figure 3S:
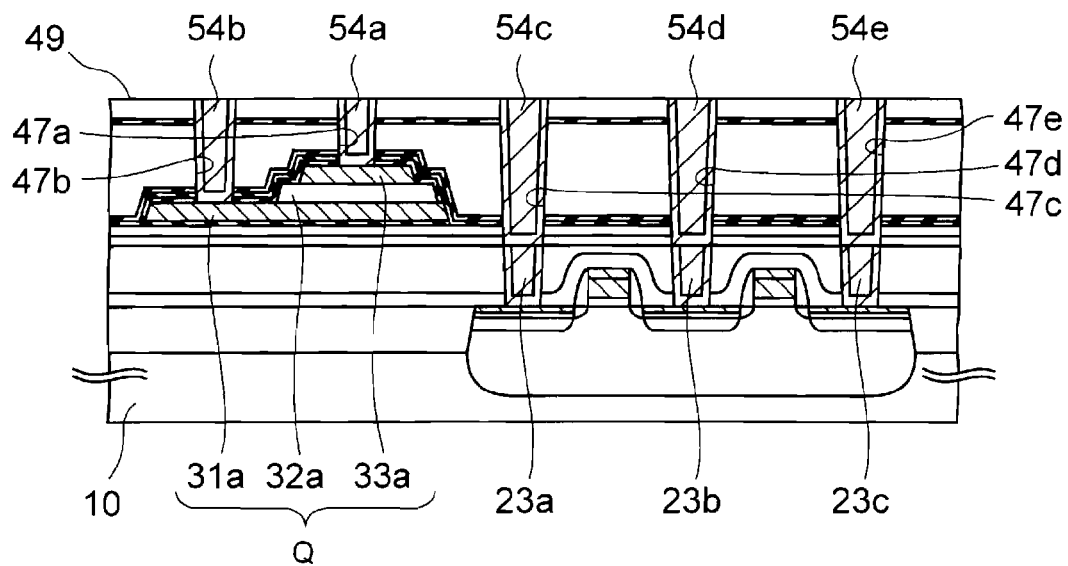
Figure 3T:
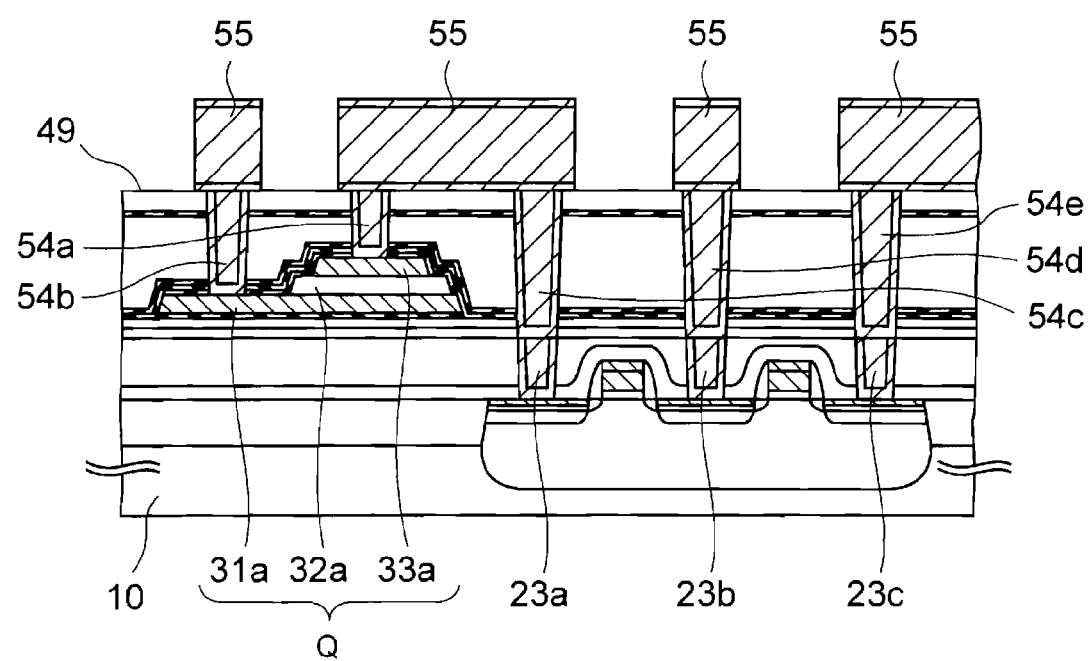

FIGS. 3A to 3T are cross-sectional views illustrating mid-processes of manufacturing a semiconductor device according to this embodiment.

This semiconductor device is a planar FeRAM and is manufactured as follows.

Firstly, description is carried out for obtaining a cross-sectional structure illustrated in FIG. 3A.

A trench for STI (Shallow Trench Isolation) is formed to demarcate an active region of a transistor on the surface of an n-type or p-type silicon (semiconductor) substrate 10, and is embedded with an insulating film such as oxide silicon to form a device isolation insulating film 11. Note that the device isolation structure is not limited to STI but may be based on the device isolation insulating film 11 formed by a LOCOS (Local Oxidation of Silicon) method.

Subsequently, a p-type impurity is introduced into the active region of the silicon substrate 10 to form a p well 12. Thereafter, the surface of the active region is thermally oxidized to form a thermal oxidation film to serve as a gate insulating film 14.

After that, a polycrystalline silicon film is formed with a thickness of approximately 200 nm on the entire upper surface of the silicon substrate 10. The resultant film is patterned by photolithography to form gate electrodes 15.

The two gate electrodes 15 are provided to be spaced apart from and be substantially parallel to each other on the p well 12. Each of the gate electrodes 15 forms a part of a word line.

Note that a material of the gate electrode 15 is not limited to a polycrystalline silicon film. Instead of the polycrystalline silicon film, an amorphous silicon film with a thickness of approximately 50 nm and a tungsten silicide film with a thickness of approximately 150 nm may be formed in this order.

Then, an n-type impurity, such as phosphorus, is introduced into a portion of the silicon substrate 10 next to the respective gate electrodes 15 by ion implantation using the gate electrodes 15 as a mask. Thus, first to third source drain extensions 16a to 16c are formed.

After that, an insulating film is formed on the entire upper surface of the silicon substrate 10, and then the insulating film is etched back to be left as insulating sidewalls 17 next to the gate electrodes 15. As for the insulating film, for example, a silicon oxide film is formed by a CVD (Chemical Vapor Deposition) method.

Subsequently, the ion implantation is carried out again to introduce an n-type impurity, such as arsenic, into the silicon substrate 10 while using the insulating sidewalls 17 and the gate electrodes 15 as a mask. Thus, first to third source drain regions 18a to 18c are formed on the silicon substrate 10 at the sides of the gate electrodes 15.

With the steps described so far, the active region of the silicon substrate 10 has thereon MOS transistors TR formed of the gate insulating films 14, the gate electrodes 15, the first to third source drain regions 18a to 18c, and the like.

Then, a sputtering method is carried out to form a refractory metal layer, such as a cobalt layer, on the entire upper surface of the silicon substrate 10. After that, the refractory metal layer is heated to thereby react with silicon. Thereby a refractory metal silicide layer 19 is formed on the silicon substrate 10. The refractory metal silicide layer 19 is also formed on the upper layer portions of the gate electrodes 15. It brings lower resistance to the gate electrodes 15.

Thereafter, wet-etching is carried out to remove the refractory metal layer left unreacted on the device isolation insulating film 11 and the like.

Subsequently, a silicon oxynitride film is formed as a cover insulating film 21 with a thickness of approximately 200 nm on the entire upper surface of the silicon substrate 10.

Thereafter, a plasma CVD method using a TEOS gas is carried out to form a silicon oxide film with a thickness of approximately 1000 nm as a first interlayer insulating film 22 on this cover insulating film 21. Then, a CMP (Chemical Mechanical Polishing) method is carried out to polish and planarize the upper surface of the first interlayer insulating film 22 so as to be approximately 785 nm in thickness on the planarized surface of the silicon substrate 10.

Then, the first interlayer insulating film 22 is patterned by photolithography to form contact holes above the first to third source drain regions 18a to 18c, respectively. After that, first to third contact plugs 23a to 23c are formed inside the contact holes.

A method of forming the first to third contact plugs 23a to 23c is not particularly limited. In the embodiment, the sputtering method is carried out to form a titanium film with thicknesses of approximately 30 nm and a titanium nitride film with thicknesses of approximately 20 nm as a glue film in this order on inner surfaces of the contact holes and the upper surface of the first interlayer insulating film 22. Then, a CVD method using a tungsten hexafluoride gas is carried out to form a tungsten film on the glue film, thereby completely embedding the contact holes with this tungsten film. After that, the CMP method is carried out to polish and remove the excessive tungsten film and glue film on the first interlayer insulating film 22. Thereby, these films are left inside the contact holes as the first to third contact plugs 23a to 23c.

The first to third contact plugs 23a to 23c are electrically connected to the respective first to third source drain regions 18a to 18c formed thereunder.

Incidentally, the first to third contact plugs 23a to 23c mainly includes tungsten as a material, as described above. Since the tungsten is oxidized very easily, contact defect may be caused by oxidization of the contact plugs 23a to 23c during process.

Accordingly, in the next step, as illustrated in FIG. 3B, the plasma CVD method is carried out to form a silicon oxynitride film as an oxidation preventing insulating film 25 for protecting the first to third contact plugs 23a to 23c from the oxidative atmosphere. Thereby the silicon oxynitride film with a thickness of approximately 100 nm is formed on the first insulating film 22 and each of the plugs 23a to 23c.

Furthermore, the plasma CVD method using a TEOS gas is carried out to form a silicon oxide film with a thickness of approximately 130 nm on the oxidation preventing insulating film 25. The resultant film serves as a first insulating adhesive film 26.

The silicon oxide film as a first insulating adhesive film 26 can be substituted for a silicon nitride film.

Thereafter, annealing is carried out on the first insulating adhesive film 26 under conditions with a substrate temperature of 650° C. and a processing time of 30 minutes to degas the first insulating adhesive film 26.

After the annealing is completed, the sputtering method is carried out to form an alumina film with a thickness of approximately 20 nm as a second insulating adhesive film 27 on the first insulating adhesive film 26.

Next, description is performed for obtaining a cross-sectional structure illustrated in FIG. 3C.

Firstly, the sputtering method is carried out to form a noble metal film such as a platinum film with a thickness of 50 nm to 150 nm. The resultant film serves as a first conductive film 31.

The film-forming conditions for the first conductive film 31 are not particularly limited. In the embodiment, to form the first conductive film 31, an argon gas as a sputtering gas is introduced into the film-forming atmosphere while a substrate temperature is maintained at 350° C. under the pressure of approximately 1 Pa and input power of 0.3 kW.

The platinum film can be substituted for a single film formed of any one of an iridium film, rhenium film, iridium oxide ($IrO_2$) film, ruthenium oxide ($RuO_2$) film, platinum oxide ($PtO_x$), $SrRuO_3$ film, and $LaSrCoO_3$ film, or a laminated film thereof.

After that, a PZT film as a ferroelectric film 32 is formed on the first conductive film 31. The PZT film is formed of two layers of an upper layer and a lower layer. The lower layer is formed by the sputtering method to be a thickness of approximately 30 nm to 150 nm, for example, 70 nm, and thereafter the annealing is carried out in the atmosphere containing oxygen to crystallize PZT. Such annealing is also referred to as crystallization annealing. In the embodiment, the crystallization annealing is carried out at a substrate temperature of approximately 620° C. and for a processing time of approximately 90 seconds. It is followed by carrying out the sputtering method to form the upper layer of the PZT film with a thickness of 5 nm to 20 nm.

Noted that, as the film-forming method for the ferroelectric film 32, in addition to the sputtering method, there are a MOCDV (Metal Organic CVD) method, sol-gel method, MOD (Metal-Organic Decomposition) method, CSD (Chemical Solution Deposition) method, CVD method, and epitaxial growth method.

Furthermore, a material of the ferroelectric film 32 is not limited to PZT as described above. The PZT as the available material of the ferroelectric film 32 can be substituted for Bi layer structure compounds such as $SrBi_2Ta_2O_9$ and $SrBi_2(Ta, No)_2O_9$ or PLZT in which lanthanum is doped into PZT. Moreover, it can be substituted for CSPLZT in which calcium, strontium and lanthanum are doped into PZT.

Thereafter, the sputtering method is carried out to form an iridium oxide ($IrO_2$) film with a thickness of 90 nm to 250 nm on the ferroelectric film 32. The formed film serves as a second conductive film 33. Note that the second conductive film 33 only needs to be a noble metal film or a noble metal oxide film. For example, the above-described iridium oxide film as the second conductive film 33 may be substituted for a noble metal film such as an iridium film or a platinum film.

Furthermore, an iridium oxide film with a double-layer structure is available for the second conductive film 33. In this case, when iridium oxide in the first layer has a chemical formula of $IrO_x$ and iridium oxide in the second layer has a chemical formula of $IrO_y$, it is preferable that the inequality of x>y be satisfied. As described above, when the composition ratio y of oxygen in the iridium oxide in the second layer is set to be larger than the composition ratio x in the iridium oxide in the first layer, the hydrogen diffusion prevention capability of the iridium oxide film in the second layer is increased to prevent the ferroelectric film 32 from being reduced by hydrogen.

Note that a film thickness of the iridium oxide film in the first layer is, for example, 20 nm to 50 nm, while a film thickness of the iridium oxide film in the second layer is, for example, 70 nm to 200 nm.

Moreover, before the iridium oxide film in the second layer is formed, RTA (Rapid Thermal Anneal) may be carried out on the iridium oxide film in the first layer in the atmosphere containing oxygen. The RTA improves the crystallinity of the ferroelectric film 32. Furthermore, it leads to planarizing the interface between the ferroelectric film 32 and the second conductive film 33 to improve electric characteristics of a ferroelectric capacitor to be described later.

The RTA is carried out, for example, under a condition of a substrate temperature of 700° C. to 750° C. and a processing time of approximately 120 seconds. The RTA is carried out in an atmosphere of a mixed gas of an argon gas with a flow rate of 1500 sccm to 3000 sccm and an oxygen gas with a flow rate of 10 sccm to 100 sccm.

Next, as illustrated in FIG. 3D, the sputtering method is carried out to form a titanium nitride film as a hard mask 35 with a thickness of approximately 34 nm on the second conductive film 33.

The hard mask 35 is not particularly limited as long as it is a film with an etching rate lower than that of a resist. For example, the titanium nitride film as the hard mask 35 can be substituted for a TiON film, $TiO_x$ film, $TaO_x$ film, TaON film, $TiAlO_x$ film, $TaAlO_x$ film, TiAlON film, TaAlON film, TiSiON film, TaSiON film, $TiSiO_x$ film, $TaSiO_x$ film, $AlO_x$ film, $ZrO_x$ film, or the like.

Furthermore, a photoresist is coated on the hard mask 35. The coated photoresist is exposed and developed to form a first resist pattern 36 in the shape of a capacitor upper electrode.

Then, as illustrated in FIG. 3E, the hard mask 35 is dry-etched on the basis of the first resist pattern 36 as a mask to pattern the hard mask 35 into a shape of a capacitor upper electrode.

The dry-etching is carried out in an unillustrated ICP (Inductively Coupled Plasma) etching chamber into which a mixed gas of a chlorine gas and an argon gas is supplied as an etching gas.

Next, as illustrated in FIG. 3F, while the ICP etching chamber is continuously used, the second conductive film 33 is dry-etched using the hard mask 35 and the first resist pattern 36 as a mask to form an upper electrode 33a.

The etching gas for the dry-etching, similar to the case of etching the hard mask 35, is the mixed gas of a chlorine gas and an argon gas.

Thereafter, the first resist pattern 36 is removed by ashing. Note that the hard mask 35 is removed by dry-etching.

Subsequently, as illustrated in FIG. 3G, a photoresist is coated on the entire upper surface of the silicon substrate 10. The coated photoresist is exposed and developed to form a second resist pattern 38 in the shape of a capacitor dielectric film.

Furthermore, the ferroelectric film 32 is dry-etched using the second resist pattern 38 as a mask. The residual ferroelectric film 32 serves as a capacitor dielectric film 32a.

Thereafter, ashing is carried out to remove the second resist pattern 38.

Note that, after removing the second resist pattern 38, annealing may be carried out on the capacitor dielectric film 32a in the atmosphere containing oxygen to recover damages which the capacitor dielectric film 32a suffers during the manufacturing processes so far. Such annealing is also referred to as recovery annealing.

In the embodiment, this recovery annealing is carried out for approximately 40 minutes under a condition with a substrate temperature of 600° C. to 700° C.

Next, as illustrated in FIG. 3H, a RF magnetron sputtering method is carried out to form an alumina film with a thickness of 20 nm to 50 nm as a first protective insulating film 40 for protecting the capacitor dielectric film 32a from the reducing atmosphere such as hydrogen.

The film-forming conditions for the first protective insulating film 40 are not particularly limited. For example, an available film-forming condition for the first protective insulating film 40 may include a sputtering gas of a single gas of argon, a film-forming pressure of approximately 1.0 Pa, a film-forming time of 40 seconds to 100 seconds, input power of 2.0 kW, and a sputtering target of an alumina ceramic target with a diameter of approximately 300 mm.

In the sputtering method, an alumina grain aggregate scattered from the alumina target is deposited on the side surface 32x of the capacitor dielectric film 32a to form an alumina film. The alumina grain aggregate does not easily get into the gaps as compared with the film-forming gas for the ALD method. Therefore, in the embodiment, an alumina film is not formed in the grain boundary of the PZT grains of the capacitor dielectric film 32a to thereby suppress variations in the composition ratio of PZT near the side surface 32x, which would be otherwise caused by alumina.

Moreover, when the alumina film is crystallized, it is likely that external hydrogen and the like intrude into the capacitor dielectric film 32a along the grain boundary of alumina. Therefore, it is preferable that an amorphous alumina film be formed as the first protective insulating film 40.

The crystallinity of the alumina film can be control with a film-forming temperature. For example, when an alumina film is formed at a substrate temperature of 350° C. or higher, the alumina film is crystallized at the time of film-forming. In contrast, when an alumina film is formed at a low substrate temperature of approximately 20° C. to 50° C., an alumina film can be formed in an amorphous state to thereby increase the reductant prevention capability of the first protective insulating film 40.

Furthermore, using the single gas of argon as a sputtering gas as described above enables to obtain another advantage of increasing a film-forming speed of the first protective insulating film 40 as compared with the case of using the mixed gas of oxygen and argon as the sputtering gas.

Note that the first protective insulating film 40 is not limited to the alumina film. For example, the alumina film as the first protective insulating film 40 can be substituted for any one of titanium oxide film, tantalum oxide film, zirconium oxide film, aluminum nitride film, and aluminum oxynitride film.

Next as illustrated in FIG. 3I, the recovery annealing is carried out on the capacitor dielectric film 32a in the atmosphere containing oxygen to recover damages which the capacitor dielectric film 32a suffers at the time of forming the first protective insulating film 40.

For example, this recovery annealing is carried out under conditions with a substrate temperature of 400° C. to 600° C. and a processing time of 30 minutes to 120 minutes.

Next, as illustrated in FIG. 3J, a photoresist is coated on the first protective insulating film 40. The coated photoresist is exposed and developed to form a third resist pattern 42 in the shape of a capacitor lower electrode.

Thereafter, the dry-etching is carried out on the first protective insulating film 40 and the first conductive film 31 by using the third resist pattern 42 as a mask. The residual first conductive film 31 serves as a lower electrode 31a. The first protective insulating film 40 is left in such a manner as to cover the capacitor dielectric film 32a and the upper electrode 33a.

At this time, the first protective insulating film 40 functions as a hard mask for the first conductive film 31. For this reason, even when the side surface of the third resist pattern 42 recedes during the etching, the first conductive film 31 is etched while the first protective insulating film 40 functions as a mask. Thus, it is possible to suppress the deformation of the lower electrode 31a, which would be otherwise caused by the receding third resist pattern 42.

Note that it is preferable that the first protective insulating film 40 be formed with a thickness of 10 nm or more to allow the first protective insulating film 40 to function as a hard mask.

Moreover, this etching also removes the second insulating adhesive film 27 in a portion which is not covered with the lower electrode 31a.

Thereafter, asking is carried out to remove the third resist pattern 42.

The steps described so far completes formation of a ferroelectric capacitor Q in which substrate 10, the lower electrode 31a, the capacitor dielectric film 32a, and the upper electrode 33a are stacked in this order above the silicon substrate.

Next, as illustrated in FIG. 3K, the annealing is carried out on the first protective insulating film 40 to evaporate impurities such as water and residuals of the third resist pattern 42, which are adhered on the first protective insulating film 40.

Evaporating water as described above can reduce an amount of water to be generated from the first protective insulating film 40 during annealing to be carried out hereinafter. Thus, the capacitor dielectric film 32a is prevented from being reduced by the water.

Moreover, the anneal enables to attain another advantage of preventing peeling-off of an alumina film to be formed in the next step on the capacitor Q.

The conditions for this annealing are not particularly limited. In the embodiment, for example, the annealing is carried out under conditions with a substrate temperature of 200° C. to 400° C. and a processing time of 30 minutes to 120 minutes. it is preferable that the annealing be carried out in the atmosphere containing oxygen as an annealing atmosphere to allow the annealing to combine with a function of supplementing oxygen deficiency of the capacitor dielectric film 32a. As the atmosphere, for example, there are an atmosphere containing only oxygen, a mixed atmosphere of argon and oxygen, and a mixed atmosphere of nitrogen and oxygen.

Incidentally, when the side surface of the third resist pattern 42 recedes during forming the lower electrode 31a (FIG. 3J), the above-described first protective insulating film 40 is exposed to the etching atmosphere at the side surface 32x of the capacitor dielectric film 32a. In this case, the thickness of the first protective insulating film 40 on the side surface 32x is decreased. Thereby, it is likely to decrease the reductant prevention capability of the first protective insulating film 40 on the side surface 32x.

For this reason, in the next step, as illustrated in FIG. 3L, an alumina film is formed again on the entire upper surface of the silicon substrate 10 as a second protective insulating film 43. This reduces a risk that the side surface 32x of the capacitor dielectric film 32a is exposed to the reductant.

A method of forming the second protective insulating film 43 is not particularly limited. On the other hand, there is a case where the first protective insulating film 40 is not left on the side surface 32x due to the receding third resist pattern 42. When the second protective insulating film 43 is formed by the ALD method in this case, as illustrated in FIGS. 2A and 2B, alumina in the second protective insulating film 43 intrudes into the grain boundary of PZT in the capacitor dielectric film 32a. Thus, it is likely to vary the ferroelectric characteristics of the capacitor dielectric film 32a.

For this reason, it is better not to use the ALD method as the method of forming the second protective insulating film 43. In the embodiment, a RF magnetron sputtering method, which is less likely to cause a risk of alumina intrusion into the PZT grain boundary, is used to form the second protective insulating film 43 with a thickness of approximately 10 nm to 30 nm.

The RF magnetron sputtering method is carried out under conditions with input power of 2.0 kW and a film-forming pressure of 1.0 Pa when a single gas of argon is used as a sputtering gas. The film-forming is carried out for approximately 40 seconds under the conditions to form a second protective insulating film 43 with a thickness of approximately 20 nm.

Furthermore, as described above, when the substrate temperature is lowered to 350° C., it enables to form the second protective insulating film 43 in an amorphous state. Thus, it is possible to suppress intrusion of the reductant in the outer atmosphere into the capacitor Q, which would otherwise occur along the alumina grain boundary of the second protective insulating film 43.

In particular, when the second protective insulating film 43 is formed at a substrate temperature as low as approximately 20° C. to 50° C., it enables to securely form the second protective insulating film 43 in an amorphous state.

Moreover, it is revealed that this low substrate temperature advantageously decreases a risk of causing the alumina grain aggregate to be particles within the sputter chamber.

Note that a CVD method in addition to the above-described sputtering method is available as a method of forming a film which can prevent alumina from intruding into the PZT grain boundary of the capacitor dielectric film 32a.

The CVD method can form a dense alumina film as compared with the sputtering method. Thus, even when the second protective insulating film 43 is formed to be as thin as approximately 1 nm to 3 nm, it is possible to maintain the reductant prevention capability of the second protective insulating film 43.

Note that the second protective insulating film 43 is not limited to the alumina film. For example, the alumina film as the second protective insulating film 43 can be substituted for any one of titanium oxide film, tantalum oxide film, zirconium oxide film, aluminum nitride film, and aluminum oxynitride film.

When the second protective insulating film 43 is formed by the sputtering method as described above, the capacitor dielectric film 32a is likely to suffer damage during forming the second protective insulating film 43.

For this reason, in the next step, as illustrated in FIG. 3M, the recovery annealing is carried out on the capacitor dielectric film 32a in an atmosphere containing an oxidative gas to recover the damages which the capacitor dielectric film 32a suffers.

The recovery annealing conditions are not particularly limited. In the embodiment, this recovery annealing is carried out under conditions with a substrate temperature of 500° C. to 700° C. for a processing time of approximately 30 minutes to 120 minutes using oxygen as an oxidative gas, for example.

The reason why the lower limit of the substrate temperature is set at 500° C. is as follows. Because, a substrate temperature lower than 500° C. is likely not to sufficiently recover the damages of the capacitor dielectric film 32a.

The reason why the upper limit of the substrate temperature is set at 700° C. is as follows. Because, the amorphous second protective insulating film 43a is crystallized at a substrate temperature higher than 700° C. to increase a risk that the reductant reaches the capacitor dielectric film 32a along the grain boundary in the second protective insulating film 43. Besides, when the second protective insulating film 43 is crystallized, there is caused an inconvenience that a material such as lead in the capacitor dielectric film 32a is drained outside along the grain boundary.

An oxygen density in the annealing atmosphere is, for example, approximately 1% to 100%.

Furthermore, when the recovery annealing is carried out as described above, there can be also obtained an advantage that it enables to evaporate an impurity such as water in the air, which is adhered onto the surface of the second protective insulating film 43.

Note that an available oxidative gas for this annealing is ozone or nitrous oxide in addition to oxygen as.

Next, as illustrated in FIG. 3N, the ALD method is carried out to form an amorphous alumina film as a third protective insulating film 44 on the second protective insulating film 43.

The third protective insulating film 44 formed by the ALD method has an excellent coverage characteristic. Thus, it is possible to form the third protective insulating film 44 with a sufficient thickness on the side surface of the capacitor Q. Thereby, it is possible to supplement the film thickness of the second protective insulating film 43, which would otherwise tend to be insufficient on the side surface of the capacitor Q.

Density of an alumina film by the AID method is different from that by the sputtering method. The alumina film by the sputtering method has a smaller density.

For example, a mean value of densities of alumina films formed by the sputtering is 3.18 g/cm$^3$ and a mean value of densities of alumina films formed by the ALD method is 3.22 g/cm$^3$.

Thus, the density of alumina in the second protective insulating film 43 formed by the sputtering method becomes smaller than that in the third protective insulating film 44 formed by the ALD method.

The film-forming conditions for the AID method are not particularly limited. In the embodiment, the third protective insulating film 44 is formed by repeating approximately 210 cycles each of which corresponds to a set of alternately switching a deposition step of supplying TMA (trimethylaluminum) into an unillustrated chamber and an oxidation step of supplying oxygen and ozone into the chamber. A vacuum purge is carried out between the deposition step and the oxidation step.

The deposition step is carried out under conditions with a substrate temperature of 300° C., a gas pressure of 40 Pa, a TMA gas flow rate of 100 sccm, and a deposition time of 5 seconds. The TMA is supplied into the chamber after it is heated to 40° C. and then evaporated.

In addition, the oxidation step is carried out under conditions with a substrate temperature of 300° C., a gas pressure of 133 Pa, and an oxidation time of 15 seconds. Note that a combined gas flow rate of oxygen and ozone is 10 slm and an ozone concentration is 200 g/Nm$^3$. Besides, only ozone may be supplied into the chamber to carry out the oxidation step.

The oxidation is carried out using these conditions in the embodiment to form the third protective insulating film 44 with a thickness of 10 nm to 100 nm. The lower limit of the film thickness is set to 10 nm because the film thickness smaller than 10 nm decreases the reductant prevention capability. On the other hand, the upper limit of the film thickness is set to 100 nm because formation of a hole in the third protective insulating film 44 in a later step is made hard by the film thickness larger than 100 nm.

The substrate temperatures in the deposition step and the oxidation step are 300° C., respectively. Otherwise, they may be within a range of 200° C. to 350° C.

The lower limit of the substrate temperature is set at 200° C. because a substrate temperature lower than 200° C. decreases the density of the alumina film to thus decrease the reductant prevention capability of the third protective insulating film 44. On the other hand, the reason why the upper limit of the substrate temperature is set to 350° C. is as follows. Specifically, the alumina film is crystallized at a substrate temperature higher than 350° C. Thus, it is likely to allow the reductant such as hydrogen in the outer atmosphere to intrude into the capacitor dielectric film 32a along the grain boundary thereof.

Further, the third protective insulating film 44 is not limited to the alumina film. For example, the alumina film as the third protective insulating film 44 can be substituted for any one of titanium oxide film, tantalum oxide film, zirconium oxide film, aluminum nitride film, and aluminum oxynitride film.

Next, as illustrated in FIG. 3O, the same chamber as used for forming the third protective insulating film 44 as described above is continuously used to anneal the third protective insulating film 44 in the atmosphere containing an oxidative gas without exposing the silicon substrate 10 to the air.

This annealing supplements the oxygen deficiency of the alumina film as the third protective insulating film 44. As a result, the composition of the alumina film comes closer to a stoichiometric composition of $Al_2O_3$ to densify the third protective insulating film 44 and to resolve instability of the alumina film due to the oxygen deficiency.

Furthermore, the annealing evaporates the OH group left in the third protective insulating film 44 formed by the ALD method. Thereby, deterioration of the capacitor dielectric film 32a due to water coming from the OH group can be suppressed.

In addition, processes from formation of the third protective insulating film 44 to this annealing are carried out without exposing the silicon substrate 10 to the air. Therefore, there is no opportunity for water in the air to adhere to the third protective insulating film 44. Accordingly, the capacitor dielectric film 32a can be prevented from being deteriorated by the water.

The annealing conditions are not particularly limited. For example, in the embodiment, the annealing may be carried out by using a mixed gas of oxygen and ozone as an oxidative gas. Note that any one of oxygen and ozone can be used as the oxidative gas.

A combined flow rate of oxygen and ozone is set to 10 slm and an ozone concentration to 200 g/Nm$^3$. In addition, a rate of temperature rise is set to approximately 10° C./minute and a substrate temperature to 400° C. to 700° C.

The lower limit of the substrate temperature is set here at 400° C. because a substrate temperature lower than 400° C. decreases the effect of densification in the third protective insulating film 44. In contrast, the upper limit of the substrate temperature is set at 700° C. because alumina in the protective insulating films and 44 is crystallized by a substrate temperature higher than 700° C., and this increases a risk that the reductant intrudes from the outside along the grain boundary thereof.

Next, as illustrated in FIG. 3P, the annealing is carried out in the atmosphere containing oxygen to further improve the density of the third protective insulating film 44 by evaporating an impurity included therein. The annealing, for example, is carried out at a substrate temperature of 500° C. to 600° C. for a processing time of 30 minutes to 90 minutes.

The oxygen density in the annealing atmosphere is approximately 1% to 100%, for example.

Next, description is performed for obtaining a cross-sectional structure illustrated in FIG. 3Q.

Firstly, a plasma CVD method using a TEOS gas as a reaction gas is carried out to form a silicon oxide film with a thickness of approximately 1400 nm as a second interlayer insulating film 47 on the third protective insulating film 44. On the upper surface of the second interlayer insulating film 47, uneven portions are formed reflecting the shape of the capacitor Q. In order to planarize these uneven portions, the CMP method is carried out to polish and planarize the upper surface of the second interlayer insulating film 47.

Furthermore, the annealing is carried out on the second interlayer insulating film 47 in the $N_2O$ plasma atmosphere under conditions with a substrate temperature of 350° C. and a processing time of 2 seconds. Thus, the second interlayer insulating film 47 is dehydrated and the surface of the second interlayer insulating film 47 is nitrided to prevent water from being absorbed again.

The annealing, instead of the $N_2O$ plasma, may be carried out in an $N_2$ plasma atmosphere.

After that, the sputtering method or the CVD method is carried out to form, on the second interlayer insulating film 47, an alumina film with a thickness of 20 nm to 50 nm as a fourth protective insulating film 48 for protecting the capacitor Q from hydrogen and water to be generated in the following steps.

Furthermore, the plasma CVD method using the TEOS gas is carried out to form a silicon oxide film with a thickness of approximately 300 nm on the fourth protective insulating film 48. The silicon oxide film serves as a cap insulating film 49.

Then, a photoresist is coated on the cap insulating film 49. The coated photoresist is exposed and developed to form a fourth resist pattern 50 including hole-shaped first and second windows 50a and 50b.

After that, while using a mixed gas of $C_4F_8$, Ar, and $O_2$ and CO as an etching gas, dry-etching is carried out on the films 40, 43, 44, and 47 to 49 through the windows 50a and 50b. With this process, a first hole 47a is formed on the upper electrode 33a and a second hole 47b is formed on the contact region of the lower electrode 31a.

After this etching is completed, the fourth resist pattern 50 is removed.

Next, as illustrated in FIG. 3R, a photoresist is coated on the cap insulating film 49. The coated photoresist is exposed and developed to form a fifth resist pattern 52 provided with a hole-shaped third window 52a on each of the first to third contact plugs 23a to 23c. The first and second holes 47a and 47b are covered with this fifth resist pattern 52.

Then, the films 25, 26, 43, 44, and 47 to 49 are dry-etched through the third window 52a, so that third to fifth holes 47c to 47e are respectively formed on the contact plugs 23a to 23c.

Such etching is carried out in a plasma etching apparatus using a mixed gas of $C_4F_8$, Ar, $O_2$, and CO as an etching gas. The oxidation preventing insulating film 25 serves as a stopper film in this etching, so that the etching stops on the oxidation preventing insulating film 25.

A mixed gas of $CHF_3$, Ar, and $O_2$ is used as an etching gas for the oxidation preventing insulating film 25.

After this, the fifth resist pattern 52 is removed.

Next, description is performed for obtaining the cross sectional structure illustrate n FIG. 3S.

Firstly, in order to cleanse inner surfaces of the first to fifth holes 47a to 47e, the inner surfaces of the holes 47a to 47e are exposed to an argon atmosphere plasmanized with high frequency power and then are sputter-etched (etched by sputtering).

Subsequently, the sputtering is carried out to form a titanium nitride film with a thickness of 50 nm to 150 nm as a glue film on the inner surfaces of the first to fifth holes 47a to 47e and the upper surface of the cap insulating film 49.

Then, the CVD method is carried out to form a tungsten film on the glue film and to completely embed the first to fifth holes 47a to 47e with the tungsten film.

Thereafter, the CMP method is carried out to polish and remove the excessive glue film and tungsten film on the upper surface of the cap insulating film 49 and to leave these films only inside the holes 47a to 47e. These films left inside the first and second holes 47a and 47b serve as first and second conductive plugs 54a and 54b which are electrically connected to the upper electrode 33a and the lower electrode 31a, respectively. In addition, the films left inside the third to fifth holes 47c to 47e serve as third to fifth conductive plugs 54c to 54e which are electrically connected to the first to third contact plugs 23a to 23c, respectively.

Next, as illustrated in FIG. 3T, the sputtering method is carried out to form a metal laminated film on each of the upper surfaces of the conductive plugs 54a to 54e and the cap insulating film 49. After that, the metal laminated film is patterned to form a meal wiring 55.

The metal laminated film is formed of, in the following order from the bottom thereof, a TiN film with a thickness of 50 nm, a copper-containing aluminum film with a thickness of 550 nm, a Ti film with a thickness of 5 nm, and a Ti film with a thickness of 50 nm.

The steps described so far complete the basic structure of a semiconductor device according to the embodiment.

According to the present embodiment, as illustrated in FIG. 3L, the second protective insulating film 43 is formed by the sputtering method with which alumina hardly intrudes into the grain boundary of the capacitor dielectric film 32a. Thus, the variations in the composition of the capacitor dielectric film 32a can be suppressed.

Furthermore, the third protective insulating film 44 is formed by the ALD method on the second protective insulating film 43 as illustrated in FIG. 3N to supplement the film thickness of the second protective insulating film 43 at the side surface 32x of the capacitor dielectric film 32a, which would otherwise tend to be thin in a film formation by the sputtering method. Accordingly, it is possible that the reductant such as hydrogen in the outer atmosphere is prevented from intruding into the capacitor dielectric film 32a from the side thereof and thereby the ferroelectric characteristic of the capacitor dielectric film 32e can be prevented from being deteriorated due to the reductant.

The inventor of this application conducted the following studies to check the degree of improvement in the ferroelectric characteristic of the capacitor Q on the basis of the second and third protective insulating films 43 and 44 which are formed as described above.

FIGS. 4 and 5 are schematic views illustrating a method of manufacturing samples.

As illustrated in FIGS. 4 and 5, samples of a comparative example, embodiments (1) to (5), and reference examples (1) and (2) are prepared for the studies.

A film thickness, an annealing temperature, and an annealing time for each of the samples are as illustrated in FIGS. 4 and 5.

In the comparative example among those embodiments and examples, a third protective insulating film 44 is not formed, which is different from the embodiments (1) to (5).

In addition, the samples for the embodiments (1) to (3) are prepared under the same conditions except the film thicknesses of the second protective insulating film 43. The thicknesses of the second protective insulating film 43 are 10 nm in the embodiment (1) which is the smallest, 15 nm in the embodiment (2), and 20 nm in the embodiment (3).

Note that the samples for the embodiments (1) to (3) are not subjected to the annealing illustrated in FIG. 3P.

In contrast, the samples for the embodiments (4) and (5) in FIG. 5 are subjected to the annealing illustrated in FIG. 3P. The annealing temperatures of the embodiments (4) and (5) are different from each other. Specifically, annealing temperatures are 550° C. in the embodiment (4) and 650° C. in the embodiment (5).

In the reference examples (1) and (2), a second protective insulating film 43 is formed by the ALD method. They are different from the embodiments (1) to (5) in each of which a second protective insulating film 43 is formed by the sputtering method.

Note that, in each sample, a capacitor dielectric film 32a has a double-layer structure formed of a lower layer and an upper layer. The first layer is a PZT film with a thickness of 90 nm and the second layer is a PZT film with a thickness of 15 nm.

A cell region in these samples has a rectangular shape with $1.0 \mu m \times 1.4$ and 1786 capacitors are formed in the cell region.

The evaluation items include (A) Qtv Characteristics of Capacitor, (B) Imprint Characteristics of Capacitor, (C) Fatigue Characteristics of Capacitor, and (D) Fatigue Loss of Capacitor.

(A) Qtv Characteristics

The Qtv characteristics of a capacitor means a relationship between an applied voltage to a capacitor and a switching charge (Qsw).

Figure 6B:
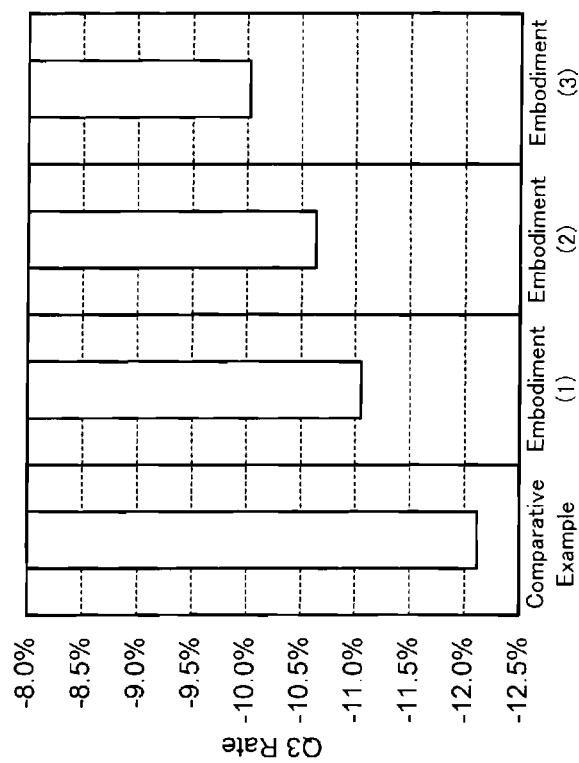
FIG. 6B is a graph (No. 1) illustrating results of the study on imprint characteristics.
Figure 6A:
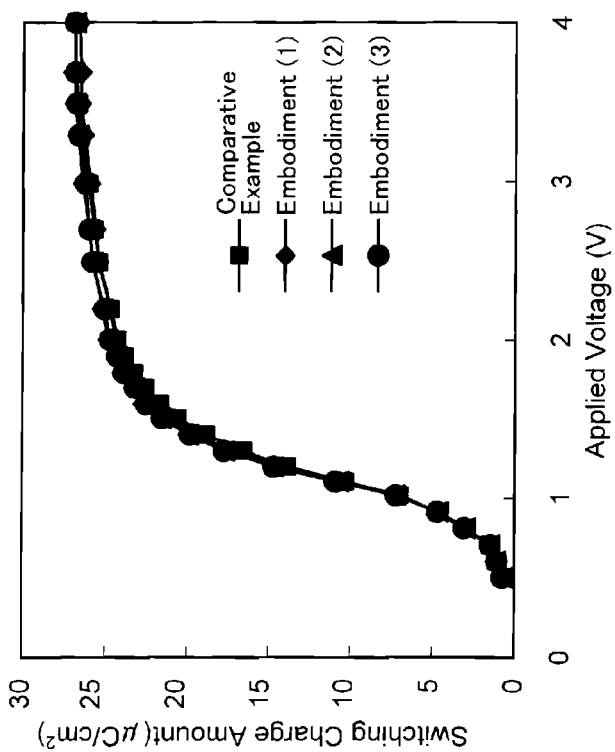
FIG. 6A is a graph (No. 1) illustrating results of the study on Qtv characteristics.

FIG. 6A illustrates the result.

As illustrated in FIG. 6A, the Qtv characteristics same as those of the comparative example can be obtained in any of the embodiments (1) to (3).

(B) Imprint Characteristics

The imprint means the phenomenon that information written in a capacitor is fixed to cause a polarization direction of a capacitor dielectric film to be hardly reversed. Such phenomenon occurs when information was written in a capacitor dielectric film and has been left unattached for a long time.

Then, when such imprint progresses, a hysteresis loop of a capacitor dielectric film shifts along the horizontal axis (voltage axis) to make writing of new information in a ferroelectric capacitor hard There is a Q3 rate for indicating the imprint characteristics. The Q3 rate is a percentage of a polarization reversal charge amount to be disappeared per unit time. It is known that as the absolute value of the Q3 rate is smaller, imprint resistance characteristics are better.

The Q3 rate is measured after information is written in two capacitors in a manner such that polarizations in the two capacitors are opposite to each other. A writing voltage is 1.8V and a substrate temperature at the time of writing is 90° C. In addition, in order to accelerate deterioration of the capacitors, the capacitors are baked at 150° C. after the information is written. Thereafter, polarization amounts of the capacitors are measured when the baking time reaches 168 hours, 334 hours, 504 hours, and 1008 hours, respectively. Then, based on these measurements, a reduction rate of the polarization reversal charge amount per unit time was obtained to calculate the Q3 rate.

The evaluation results of the Q3 rate are illustrated in FIG. 6B.

As illustrated in FIG. 6B, an absolute value of the Q3 rate in each of the embodiments (1) to (3) is smaller than that of the comparative example, which indicates that the imprint characteristics of the embodiments (1) to (3) are improved as compared with those of the comparative example.

Moreover, when comparison with regard to the Q3 rate is made among the embodiments (1) to (3), the Q3 rate is improved more in the order of the embodiments (1), (2), and (3). The reason is that the film thickness of the second protective insulating film 43 becomes thicker in the order of the embodiments (1), (2), and (3). In other words, it is conceivable that the reductant prevention capability of the second protective insulating film 43 is improved as the film thickness is larger.

In particular, in the embodiment (3) in which the film thickness of the second protective insulating film 43 formed by the sputtering method was as thick as 20 nm, the Q3 rate is improved as much as approximately 2.1% as compared with that of the comparative example.

(C) Fatigue Characteristics

The fatigue characteristics of capacitor Q can be grasped in a manner such as repeatedly reversing directions of applied voltage to the capacitor Q and then finding how much the switching charge is reduced by comparing the switching charge before and after the application of the voltage.

Figure 7B:
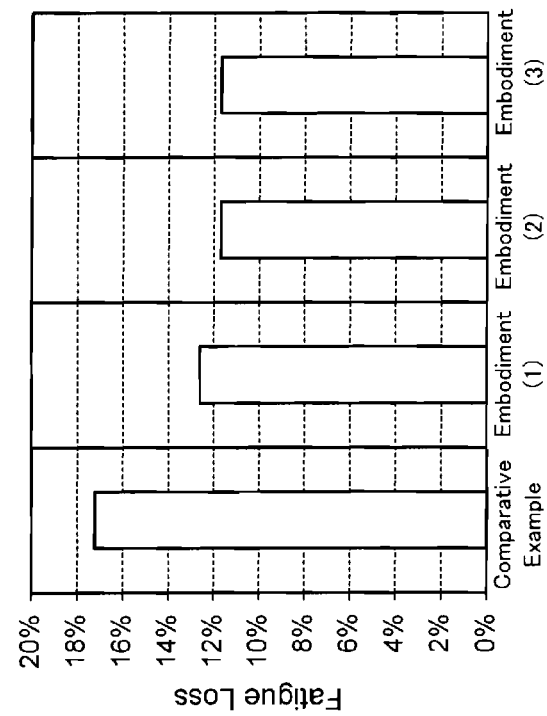
FIG. 7B is a graph (No. 1) illustrating results of the study on fatigue loss.
Figure 7A:
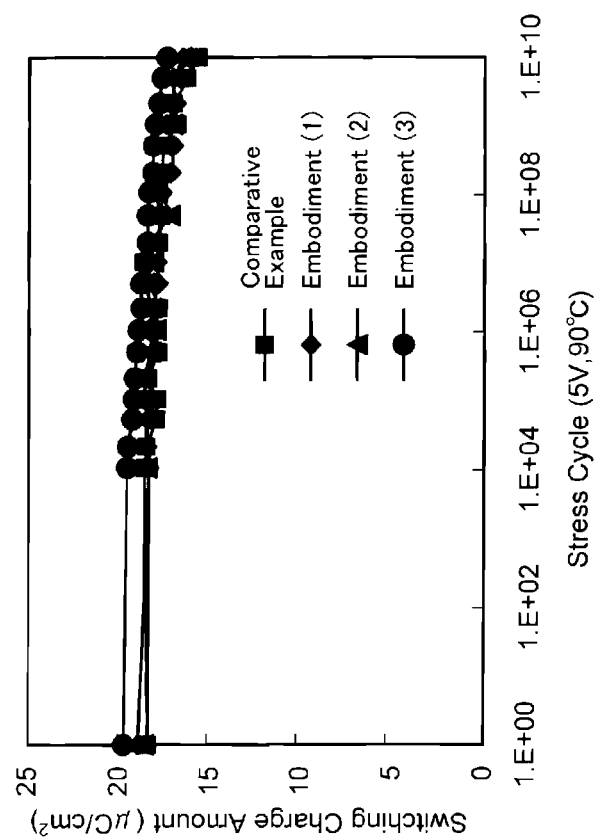
FIG. 7A is a graph (No. 1) illustrating results of the study on fatigue characteristics.

The results of the study are illustrated in FIG. 7A.

In this study, while the temperature of the capacitor Q is maintained at 90° C., a voltage of 5V which is higher than that under actual use is applied to the capacitor Q. Then, the direction of the voltage is reversed several times to measure the switching charge amount which appears at the time of applying a voltage of 1.8V to the capacitor Q. Note that in this example, the number of voltage reversals is referred to as a stress cycle.

As illustrated in FIG. 7A, in any of the embodiments (1) to (3), the reduction in the switching charge is suppressed as compared with that in the comparative example.

(D) Fatigue Loss of Capacitor

The fatigue loss is measured after carrying out an accelerated test on a capacitor. The accelerated test is carried out in a manner to repeatedly reverse directions of applied voltage to the capacitor Q while heating the capacitor Q. Then, when the maximum value of the switching charge Qsw in the test is "maximum Qsw," the fatigue loss is calculated by the following equation.

Fatigue loss=100×{(maximum Qsw)−(Qsw after acceleration)}/(maximum Qsw)

The results of measuring the fatigue loss are illustrated in FIG. 7B. In this example, an applied voltage to the capacitor is set to 5V and the number of reversing the direction of the voltage is set to $1 \times 10^{10}$ times.

As illustrated in FIG. 7B, the fatigue losses of the embodiments (1) to (3) are less than that of the comparative example. Accordingly, it is conceivable that the electric characteristics of the capacitor Q are improved.

In particular, in the embodiment (3) in which the thickness of the second insulating film 43 is the largest among the embodiment (1) to (3) formed by the sputtering method, the fatigue loss is improved by approximately as much as 5% as compared with that of the comparative example.

The foregoing description is given of the results of studying the embodiments (1) to (3) in which the thickness of the second protective insulating film 43 is changed.

Description is now given of the results of studying the embodiments (4) and (5) in FIG. 3P, in which the annealing temperature is changed. Note that the study results of the embodiment (3) and the comparative example are also illustrated for comparison in the following description.

(A) Qtv Characteristics

Figure 8B:
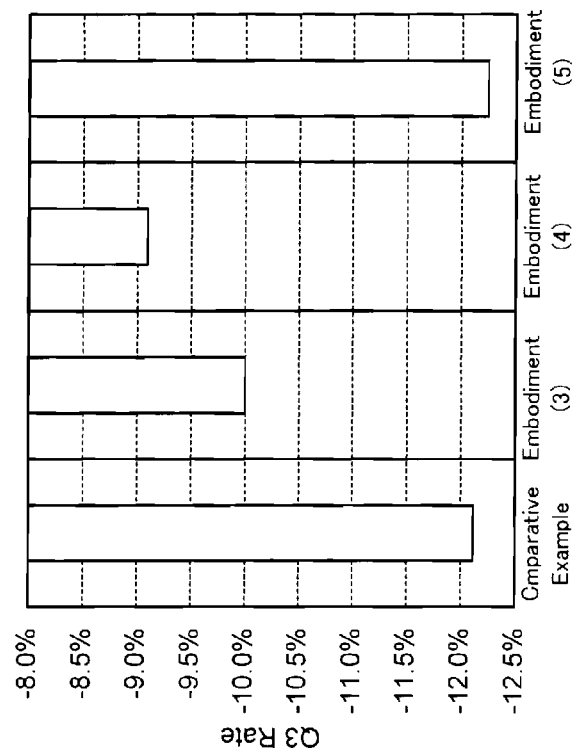
FIG. 8B is a graph (No. 2) illustrating results of the study on imprint characteristics.
Figure 8A:
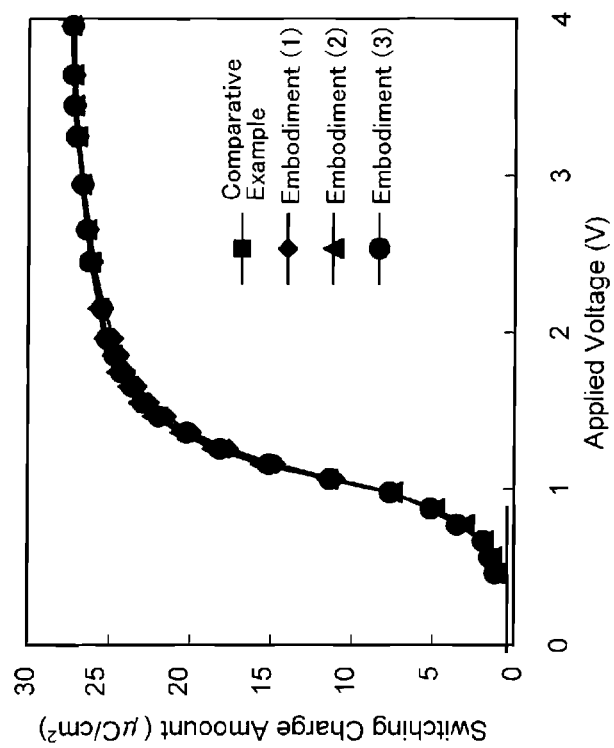
FIG. 8A is a graph (No. 2) illustrating results of the study on Qtv characteristics.

FIG. 8A illustrates the results of measuring the Qtv characteristics.

As illustrated in FIG. 8A, the Qtv characteristics same as those in the comparative example and the embodiment (3) can be gained in any of the embodiments (4) and (5).

(B) Imprint Characteristics

FIG. 8B illustrates the results of measuring the Q3 rate.

As illustrated in FIG. 8B, the Q3 rate of the embodiment (5) is deteriorated as compared with those of the comparative example and the embodiments (3) and (4).

It is conceivable that when the annealing of FIG. 3P is carried out at a temperature as high as 650° C. as in the embodiment (5), the capacitor dielectric film 32a is deteriorated by being baked in steam due to the impurity such as water in the air, which adheres to the third protective insulating film 44.

In contrast, in the embodiment (4) in which the annealing of FIG. 3P is carried out at 550° C., the Q3 rate is further improved than that in the embodiment (3).

Based on these results, it is revealed that the substrate temperature at the time of the annealing of FIG. 3P has an influence on the Q3 rate of the capacitor, and that it is preferable that the annealing is performed at a substrate temperature equal to or lower than 650° C., for example, 500° C. to 600° C. to improve the Q3 rate.

(C) Fatigue Characteristics of Capacitor

Figure 9B:
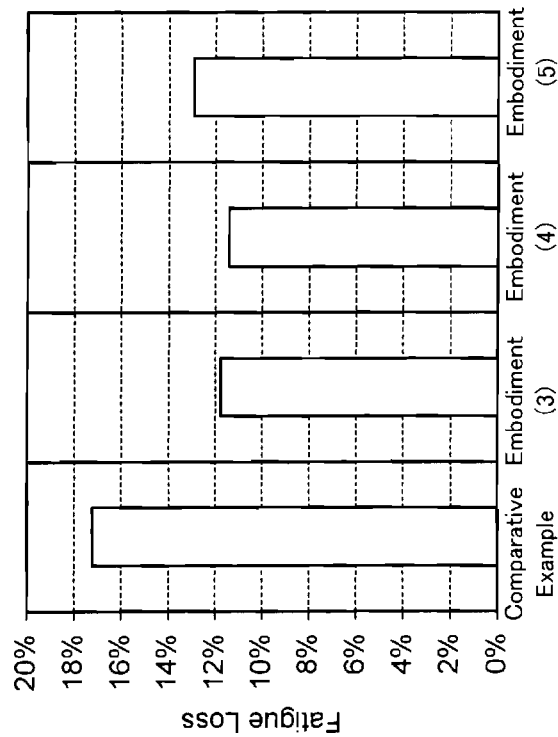
FIG. 9B is a graph (No. 2) illustrating results of the study on fatigue loss.
Figure 9A:
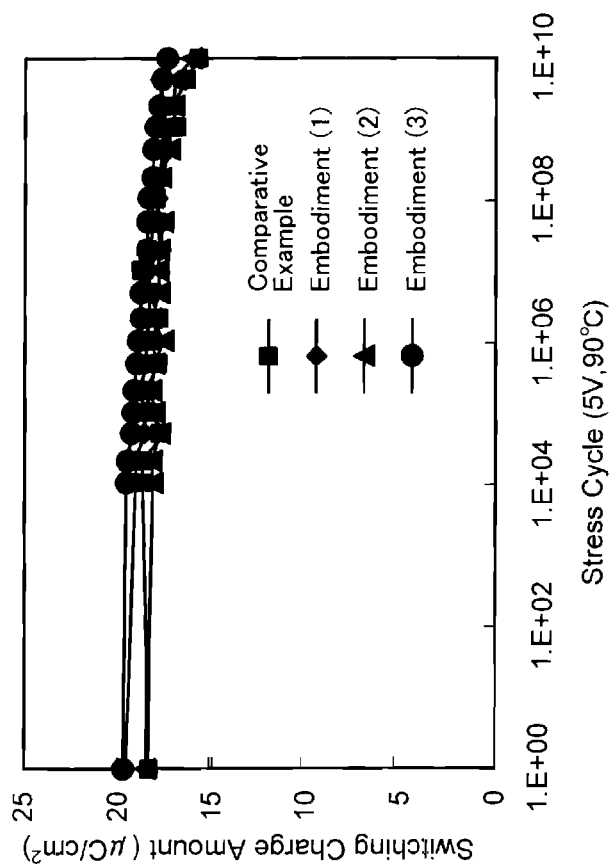
FIG. 9A is a graph (No. 2) illustrating results of the study on fatigue characteristics.

FIG. 9A illustrates the results of the study on the fatigue characteristics.

As illustrated in FIG. 9A, in any of the embodiments (4) and (5), the switching charge is kept substantially equal to those of the comparative example and the embodiment (3).

(D) Fatigue Loss of Capacitor

FIG. 9B illustrates the results of the study on the fatigue loss of the capacitor.

As illustrated in FIG. 9B, the fatigue loss of the embodiment (5) is deteriorated as compared with those of the comparative example and the embodiments (3) and (4).

Similar to the case of the imprint characteristics, it is conceivable that when the annealing of FIG. 3P is carried out at a temperature as high as 650° C. as in the embodiment (5), the capacitor dielectric film 32a is baked in steam due to the impurity such as water in the air, which adheres to the third protective insulating film 44.

In contrast, in the embodiment (4) in which the annealing of FIG. 3P is carried out at a temperature as low as 550° C., the fatigue loss is suppressed to the extent substantially equal to that of the embodiment (3).

Based on these results, it is revealed that the substrate temperature at the time of the annealing of FIG. 3P has an influence on the fatigue loss of the capacitor, and that it is preferable that the annealing is carried out at a substrate temperature equal to or lower than 650° C., for example, 500° C. to 600° C. to improve the fatigue loss.

The foregoing description is given of the results of studying the embodiments (1) to (5) in which the second protective insulating film 43 is formed by the sputtering method.

Description is now given below of the results of studying the reference examples (1) and (2) in which the second protective insulating film 43 is formed by the ALD method. Note that the study results of the embodiment (3) and the comparative example are also described at the same time for comparison.

(A) Qtv Characteristics

Figure 10B:
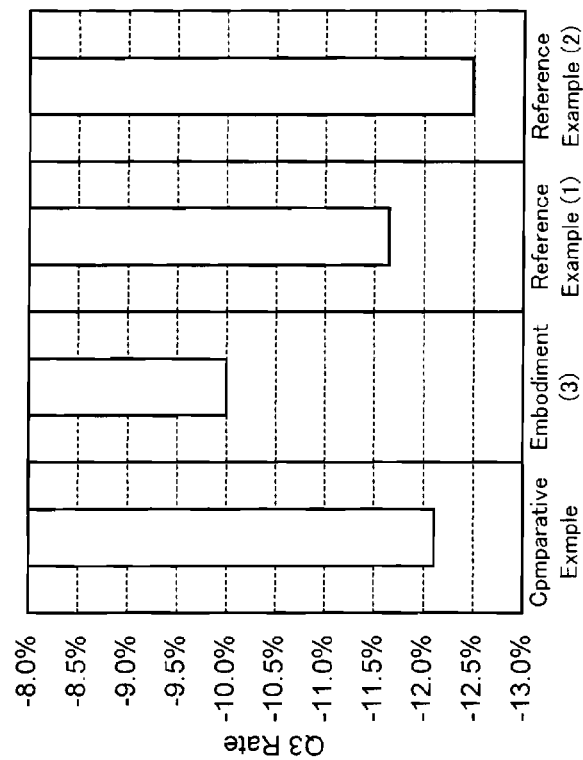
FIG. 10B is a graph (No. 3) illustrating results of the study on imprint characteristics.
Figure 10A:
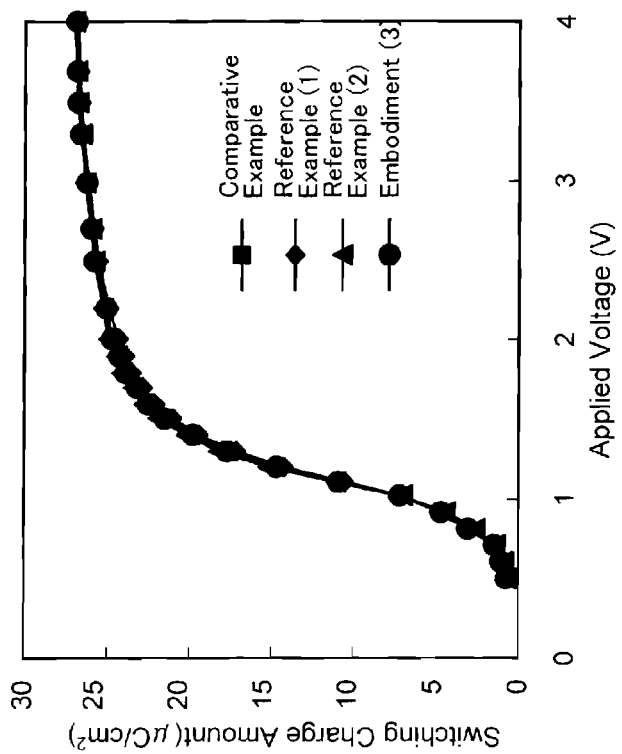
FIG. 10A is a graph (No. 3) illustrating results of the study on Qtv characteristics.

FIG. 10A illustrates the results of the study on the Qtv characteristics.

As illustrated in FIG. 10A, the Qtv characteristics same as those in the comparative example can be gained in any of the reference examples (1) and (2).

(B) Imprint Characteristics

FIG. 10B illustrates the results of the study on the Q3 rate.

As illustrated in FIG. 10B, the Q3 rates of the reference examples (1) and (2) are deteriorated as compared with the Q3 rate of the embodiment (3).

The reason would be, as described above, that when the second protective insulating film 43 is formed by the ALD method, alumina in the second protective insulating film 43 intrudes into the capacitor dielectric film 32a in the side surface of the capacitor Q to thereby vary the composition of the capacitor dielectric film 32a.

(C) Fatigue Characteristics of Capacitor

Figure 11B:
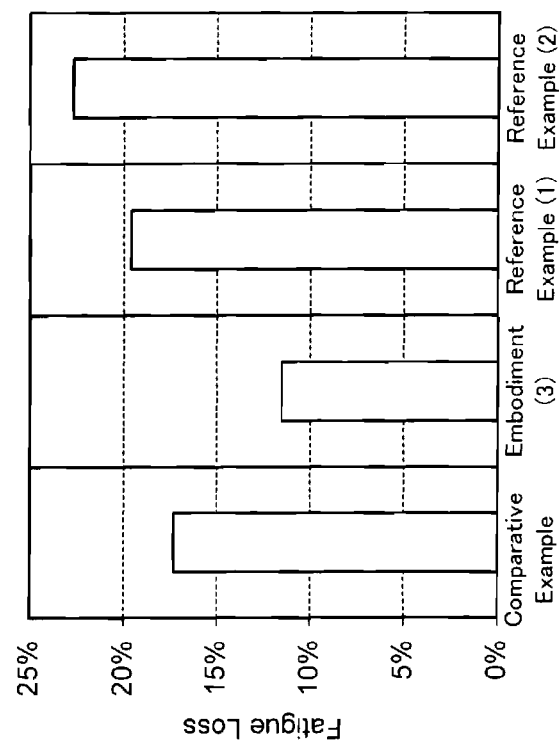
FIG. 11B is a graph (No. 3) illustrating results of the study on fatigue loss.
Figure 11A:
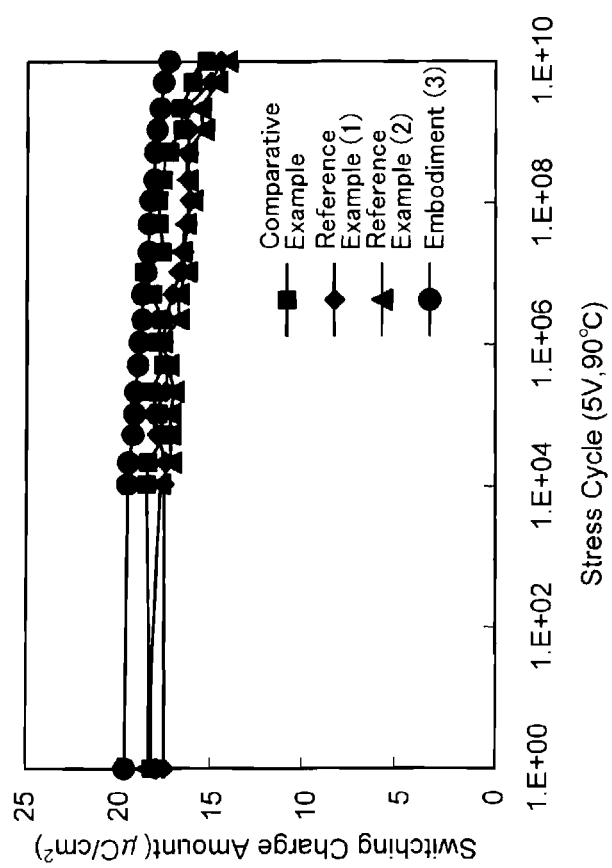
FIG. 11A is a graph (No. 3) illustrating results of the study on fatigue characteristics.

FIG. 11A illustrates the results of the study on the fatigue characteristics.

As illustrated in FIG. 11A, the switching charge in the reference examples (1) and (2) are lowered as compared with those of the embodiment (3) and the comparative example.

The reason would be, as described above, that the second protective insulating film 43 is formed by the ALD method to thereby vary the composition of the capacitor dielectric film 32a.

(D) Fatigue Loss of Capacitor

FIG. 11B illustrates the results of the study on the fatigue loss.

As illustrated in FIG. 11B, the fatigue losses of the reference examples (1) and (2) are deteriorated as compared with those of the embodiment (3) and the comparative example. The reason would be also, as descrived above, that the second protective insulating film 43 is formed by the ALD method, and thereby alumina intrudes into the capacitor dielectric film 32a to vary the composition of the capacitor dielectric film 32a.

As described above, in the reference examples (1) and (2) using the ALD method as a method of forming the second protective insulating film 43, the imprint characteristics, the fatigue characteristics, and the fatigue loss are all inferior to those in the embodiment (3) using the sputtering method to form the second protective insulating film 43. Based on these results, it is revealed that it is preferable in order to improve these electric characteristics that the second protective insulating film 43 is formed by the sputtering method.

(Second Embodiment)

Description in the first embodiment is performed for the planar-type FeRAM. In contrast, description in the present embodiment is performed for a stack-type FeRAM in which a conductive plug is formed right under a lower electrode. The stack-type FeRAM is small in an occupied area of a capacitor as compared with the planar-type FeRAM. Thus, the stack-type FeRAM is advantageous in higher integration thereof.

Figure 12A:
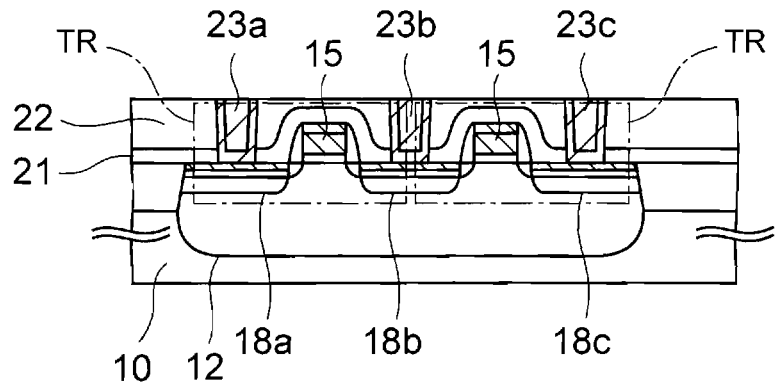
FIGS. 12A to 12S are cross-sectional views illustrating mid-processes of manufacturing a semiconductor device according to a second embodiment.
Figure 12B:
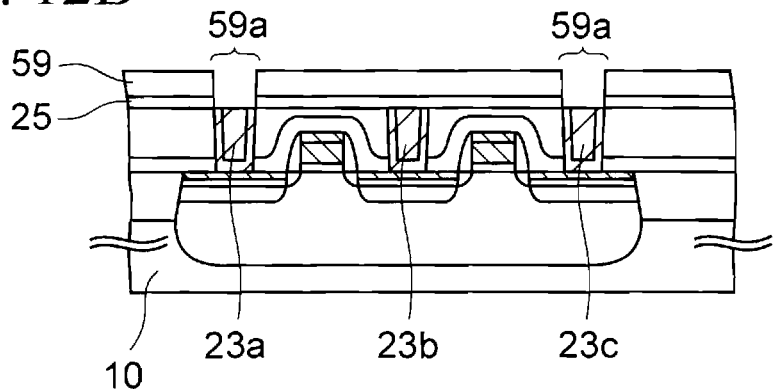
Figure 12C:
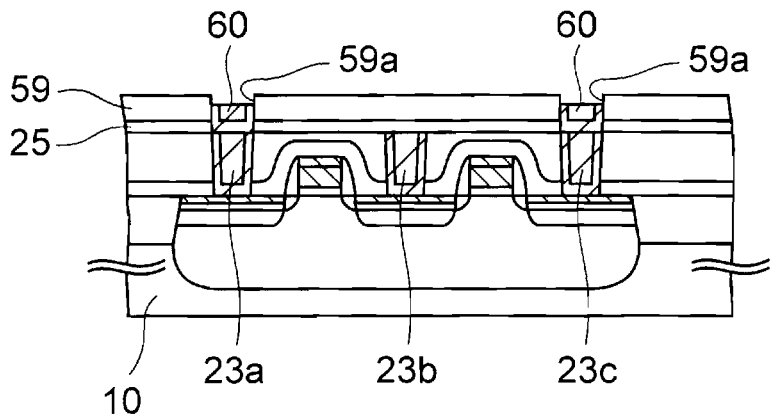
Figure 12D:
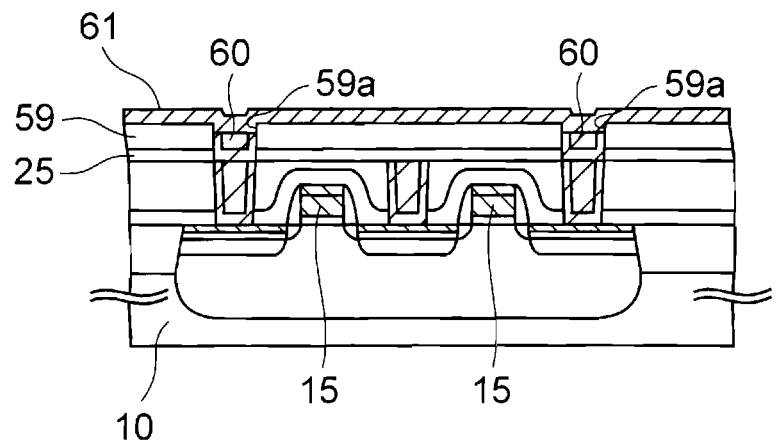
Figure 12E:
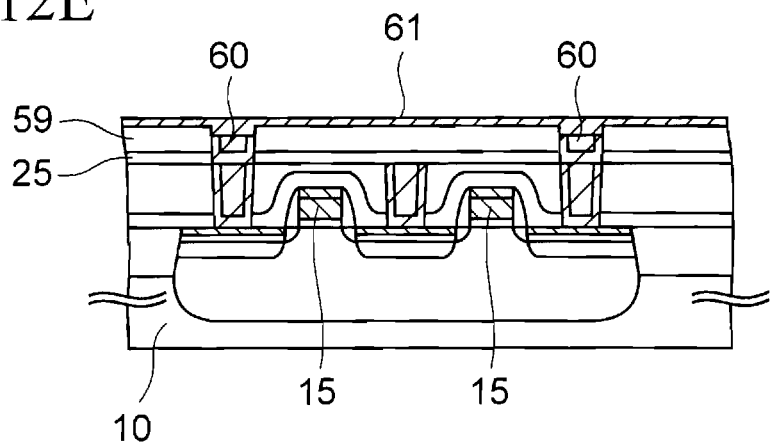
Figure 12F:
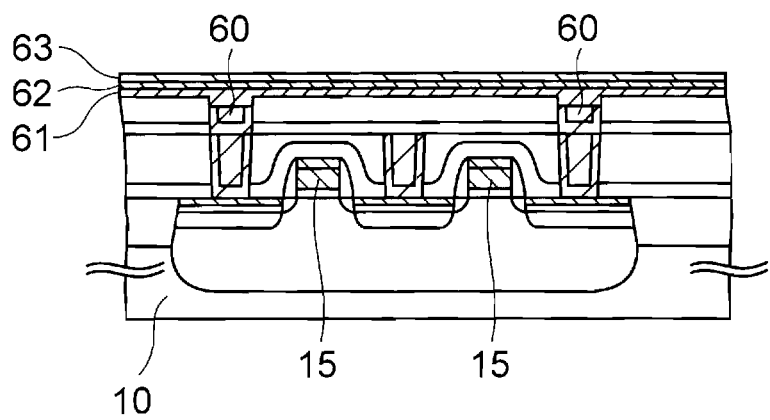
Figure 12G:
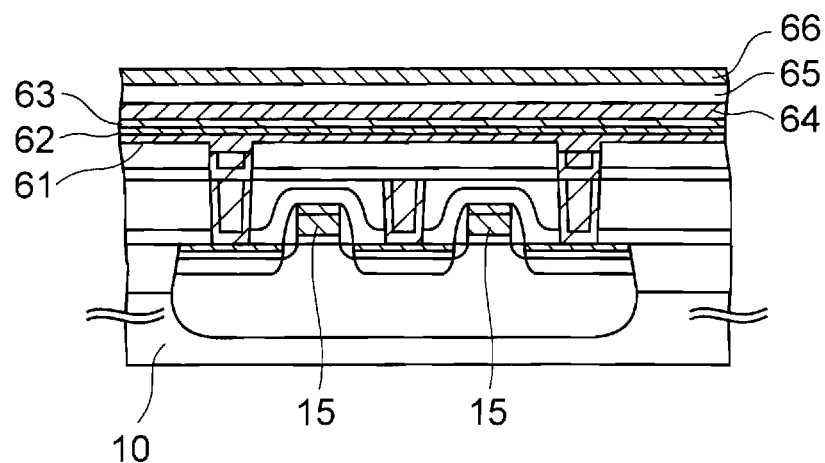
Figure 12H:
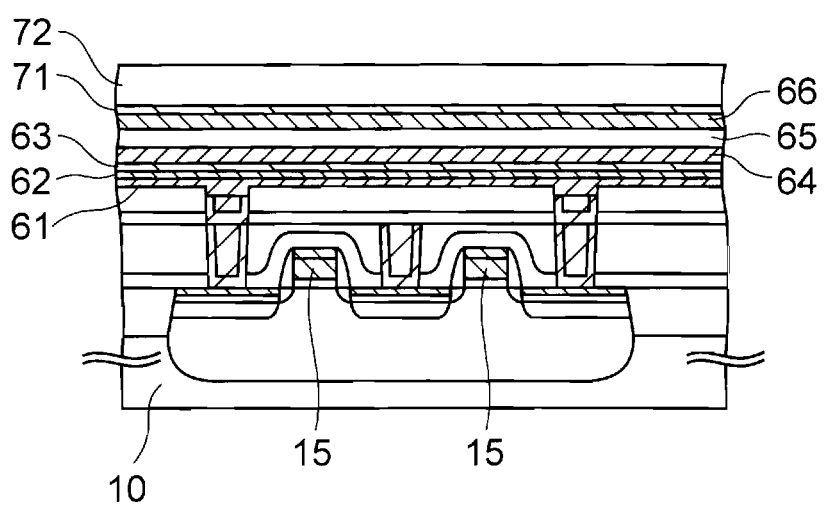
Figure 12I:
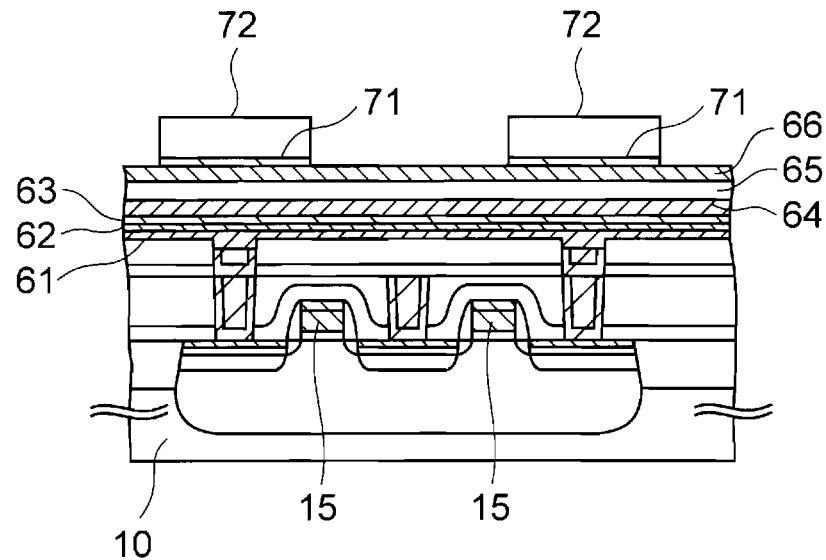
Figure 12J:
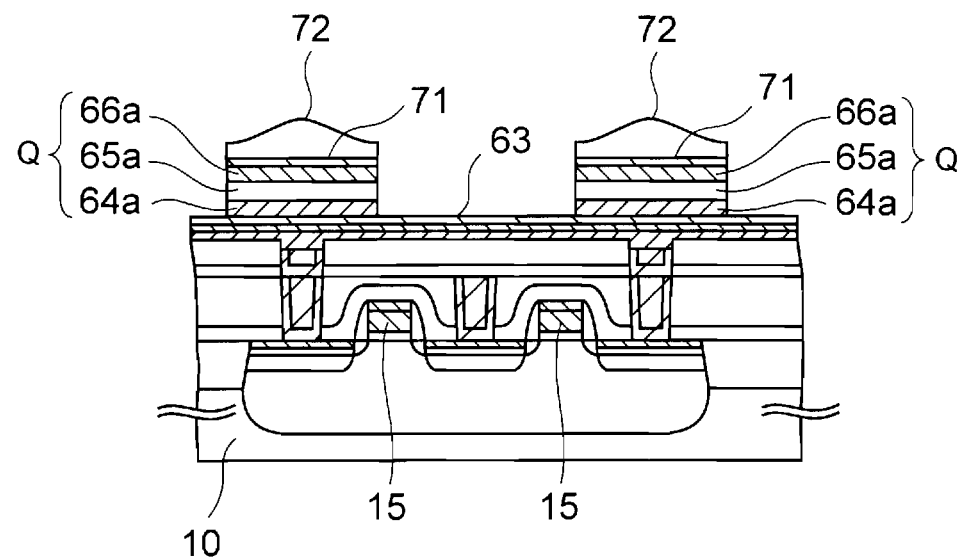
Figure 12K:
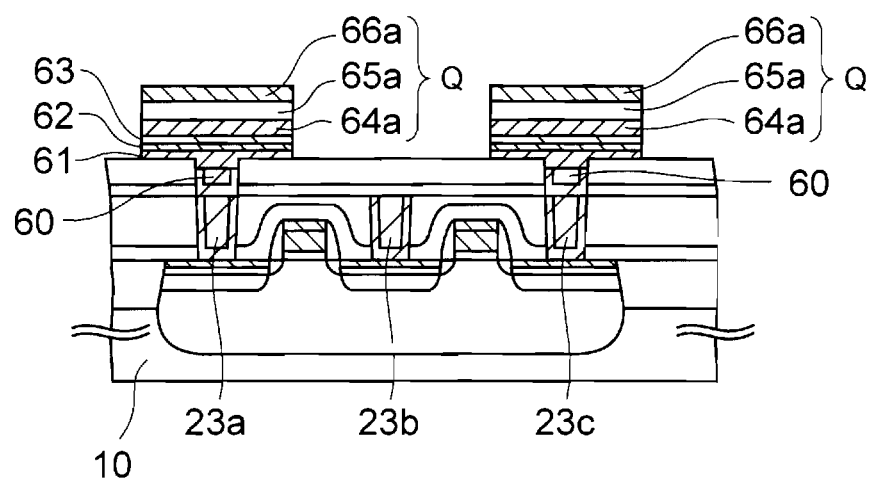
Figure 12L:
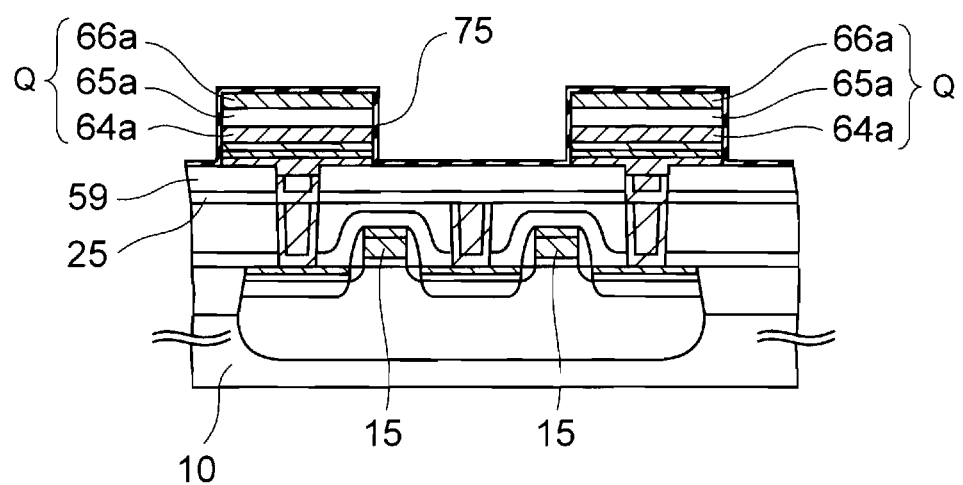
Figure 12M:
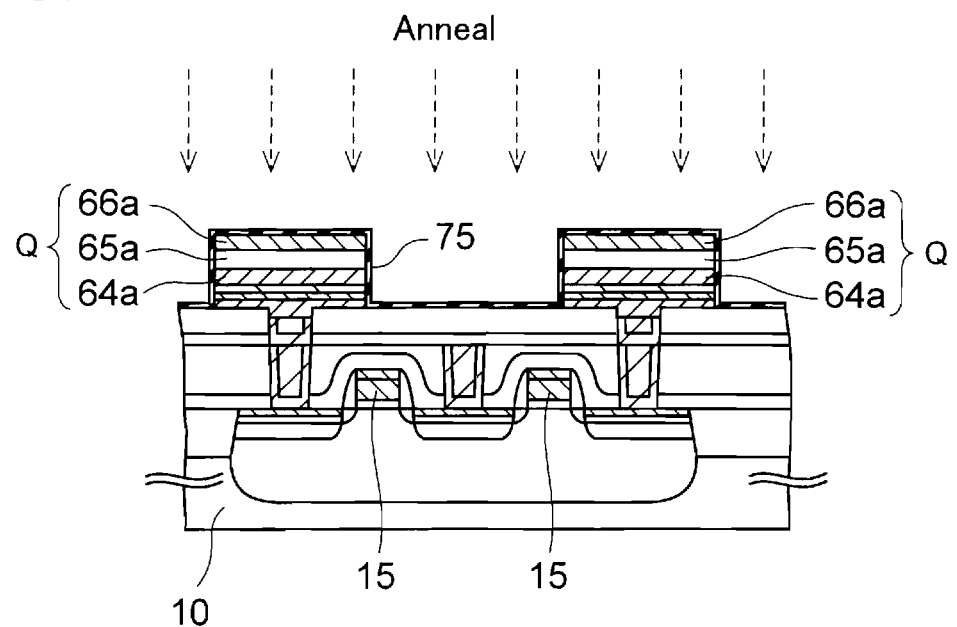
Figure 12N:
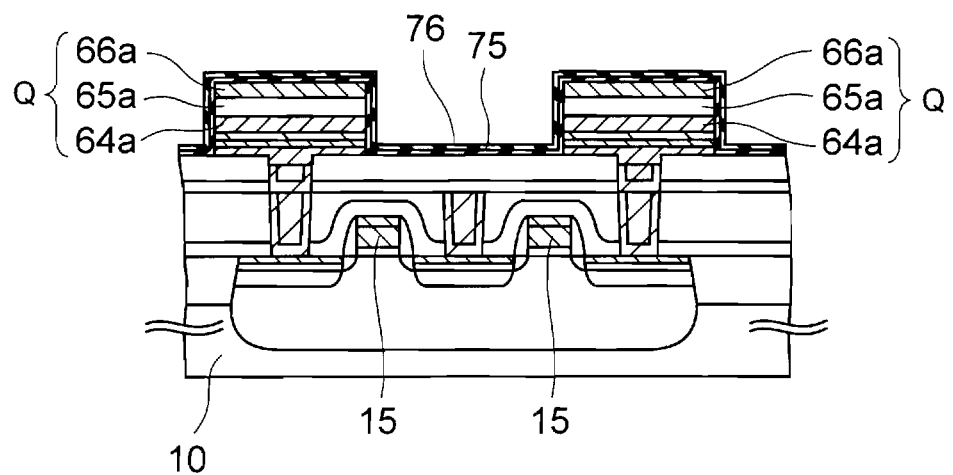
Figure 12O:
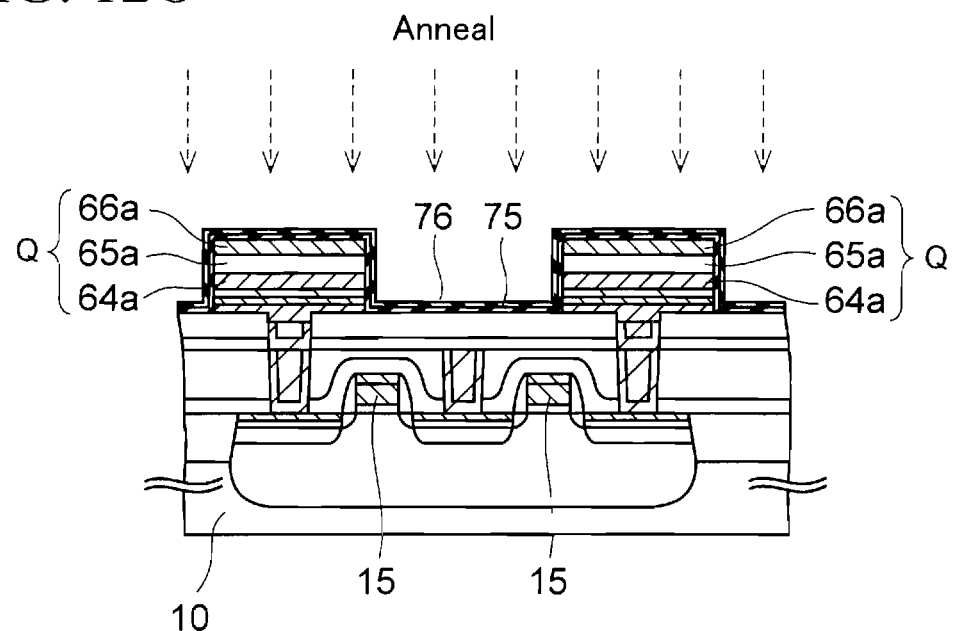
Figure 12P:
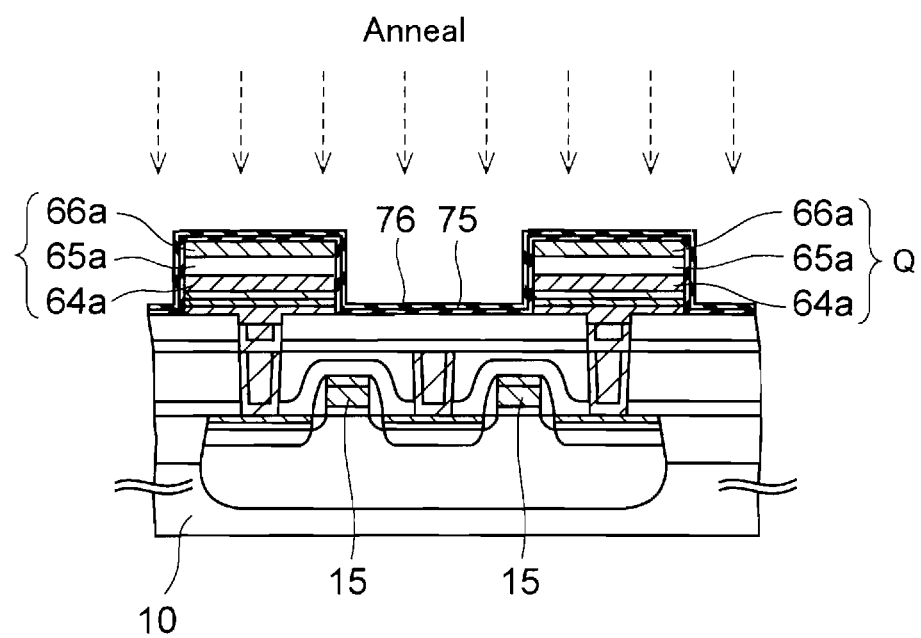
Figure 12Q:
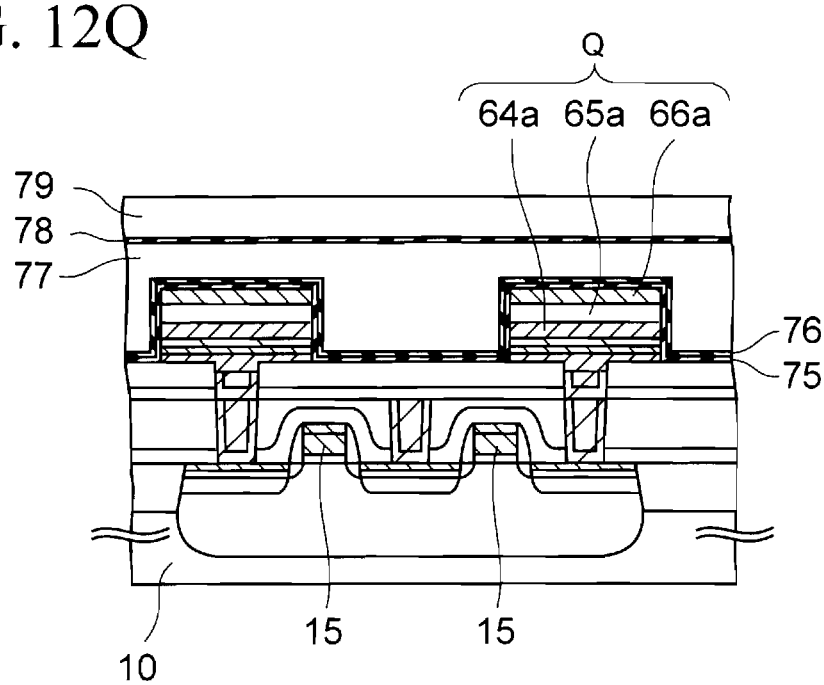
Figure 12R:
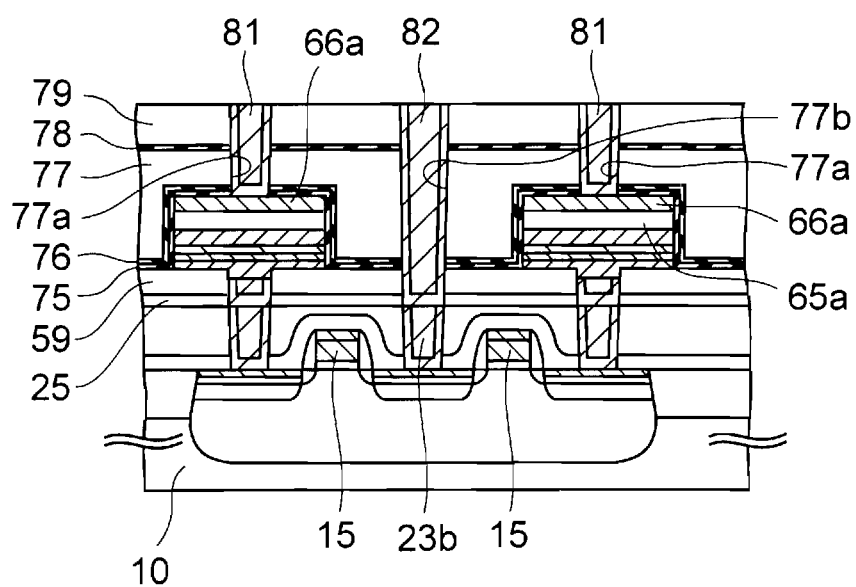
Figure 12S:
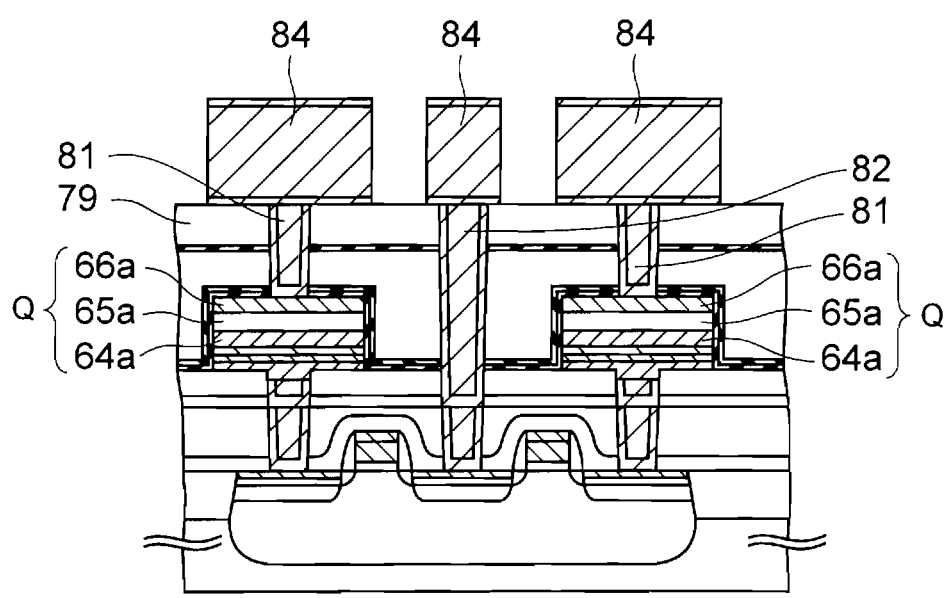

FIGS. 12A to 12S are cross-sectional views illustrating mid-processes of manufacturing a semiconductor device according to the embodiment. In these drawings, components same as those of the first embodiment are denoted by reference numerals same as those of the first embodiment, and the description thereof is omitted below.

This semiconductor device is manufactured as follows.

Firstly, as illustrated in FIG. 12A, the step of FIG. 3A in the first embodiment is carried out to form a MOS transistor TR and first to third contact plugs 23a to 23c.

Then, as illustrated in FIG. 12B, a plasma CVD method is carried out to form a silicon oxynitride film with a thickness of approximately 130 nm on a first interlayer insulating film 22 and the respective contact plugs 23a to 23c. The silicon oxynitride film serves as an oxidation preventing insulating film 25 for protecting the contact plugs 23a to 23c from an oxidative atmosphere.

Furthermore, the plasma CVD method using a TEOS gas is carried out to form a silicon oxide film with a thickness of approximately 300 nm on the antioxidant insulating film 25. The resultant film serves as an insulating adhesive film 59.

Thereafter, each of the oxidation preventing insulating film 25 and the insulating adhesive film 59 is patterned to form a first hole 59a on each of the first contact plug 23a and the third contact plug 23c.

Then, as illustrated in FIG. 12C, a first conductive plug 60 is formed inside the first hole 59a to be connected with each of the first contact plug 23a and the third contact plug 23c.

A method of forming the first conductive plug 60 is not particularly limited.

In the embodiment, a titanium film, a titanium nitride film, and a tungsten film are formed in this order on the upper surface of the insulating adhesive film 59 and the inner surface of the first contact hole 59a. A CMP method is carried out to polish these films and thereby leave these films only inside the first hole 59a as the first conductive plug 60.

Note that the film thickness of the titanium film is approximately 30 nm and the film thickness of the titanium nitride film is 20 nm.

This CMP is performed using slurry having a faster polishing speed for a polishing target, such as each of the titanium film, the titanium nitride film and the tungsten film, as compared with that for the base insulating adhesive film 59. The available slurry is SSW2000 manufactured by Cabot Microelectronics Corporation, for example.

Moreover, a polishing amount with this CMP is set thicker than the total film thickness of the titanium film, titanium nitride film, and tungsten film to leave no polishing residual on the insulating adhesive film 59. In other words, overpolishing is performed with this CMP.

As a result, the upper surface of the first conductive plug 60 becomes lower than that of the insulating adhesive film 59. Thereby, a recessed portion may be formed in the insulating adhesive film 59 in the circumference of the first conductive plug 60. A depth of the recess is 20 nm to 50 nm.

Next, as illustrated in FIG. 12D, the sputtering method is carried out to form a titanium film with a thickness of 100 nm to 300 nm, for example, 100 nm as a base conductive film 61 on each of the insulating adhesive film 59 and the first conductive plug 60.

Note that $NH_3$ plasma processing may be carried out on the insulating adhesive film 59 before the base conductive film 61 is formed. Such $NH_3$ plasma processing allows NH groups to bond to oxygen atoms on the surface of the insulating adhesive film 59, thereby preventing titanium of the base conductive film 61 from being captured by oxygen atoms. For this reason, the titanium atoms can freely move on the surface of the insulating adhesive film 59 to thereby obtain the base conductive film 61 formed of titanium which is self-organized in a (002) direction.

After that, annealing is carried out on the base conductive film 61 in the nitrogen atmosphere to nitride titanium of the base conductive film 61. The titanium nitride obtained by nitriding as described above is aligned in a (111) direction, which is preferable to cause PZT described below to be aligned in the (111) direction.

Subsequently, as illustrated in FIG. 12E, the CMP method is carried out to polish and planarize the upper surface of the base conductive film 61. Slurry used in this CMP is not particularly limited. In the embodiment, an available slurry is SSW2000 manufactured by Cabot Microelectronics Corporation.

As described above, planarization of the upper surface of the base conductive film 61 enables to improve a crystallinity of a ferroelectric film to be formed later above the base conductive film 61.

Note that a thickness of the base conductive film 61 after the polishing is 50 nm to 100 nm, for example, 50 nm.

Furthermore, the $NH_3$ plasma processing may be carried out on the base conductive film 61 after the polishing to thereby resolve the crystalline deformation of the base conductive film 61 which is caused by the polishing and to prevent the deterioration of the crystallinity of a lower electrode to be formed later above the base conductive film 61.

Subsequently, as illustrated in FIG. 12F, the sputtering method is carried out to form a titanium film as a crystalline conductive film 62 with a thickness of approximately 20 nm on the base conductive film 61. Furthermore, RTA is carried out on the crystalline conductive film 62 in the nitrogen atmosphere with a substrate temperature of 650° C. for a processing time of 60 seconds to nitride the crystalline conductive film 62.

With this process, it is possible to obtain the crystalline conductive film 62 including titanium nitride which is aligned in the (111) direction.

The crystalline conductive film 62 is also provided with a function as an adhesive film in addition to a function to improve the orientation of a film to be formed later on the crystalline conductive film 62 by the action of orientation of itself.

Furthermore, the sputtering method is carried out to form a titanium aluminum nitride (TiAlN) film with a thickness of approximately 100 nm as a conductive oxygen barrier film 63 on the crystalline conductive film 61.

Next, description is performed for obtaining a cross sectional structure illustrated in FIG. 12G.

Firstly, the sputtering method is carried out to form an iridium film with a thickness of approximately 100 nm and an iridium oxide film with a thickness of approximately 25 nm as a first conductive film 64 on the conductive oxygen barrier film 63.

After that, the MOCVD method is carried out to form a PZT film with a thickness of 30 nm to 150 nm, for example, 90 nm, as a ferroelectric film 65 on the first conductive film 64.

This MOCVD method is carried out in the following manner.

Firstly, each of Pb, Zr, and Ti liquid sources may be made by dissolving each of $Pb(DPM)_2$ (chemical formula: $Pb(C_{11}H_{19}O_2)_2$) $Zr(dmhd)_4$ (chemical formula: $Zr(C_9H_{15}O_2)_4$) and $Ti(O\text{-}iOr)_2(DPM)_2$ (chemical formula: $Ti(C_3H_7O)_2(C_{11}H_{19}O_2)_2$) into a THF (Tetra Hydro Furan: $C_4H_8O$) solvent with a concentration of 0.3 mol/l. Subsequently, the above-described liquid sources are supplied to the carburetor respectively with the flow rates of 0.326 ml per minute, 0.200 ml per minute, and 0.200 ml per minute and are vaporized to obtain the source gases of Pb, Zr, and Ti. Note that a THF solvent with a flow rate of 0.474 ml per minute is also supplied to the carburetor together with the liquid sources.

Furthermore, while the source gases are supplied to the chamber, the pressure inside the chamber is maintained at 665 Pa and a substrate temperature is maintained at 620° C. Such state is maintained for a predetermined period of time to form the above-described PZT film with a thickness of 90 nm.

The ferroelectric film 65 formed by the MOCVD method is already crystallized at the time of film forming, and crystallization annealing is not necessary.

Note that a method of forming the ferroelectric film 65 is not particularly limited to the MOCVD method, and the ferroelectric film 65 may be formed by the sputtering method. In this case, since the ferroelectric film 65 is not crystallized at the time of film forming, it is necessary to carry out crystallization annealing after the film forming.

Furthermore, the ferroelectric film 65 may be formed in a double-layer structure of a PZT film formed by the MOCVD and a PZT film formed thereon by the sputtering method.

Thereafter, the sputtering method is carried out to form an iridium oxide film and an iridium film in this order as a second conductive film 66 on the ferroelectric film 65.

A film thickness of the second conductive film 66 is not particularly limited. In the embodiment, the iridium oxide film is formed of a lower layer with a film thickness of 20 nm to 50 nm and an upper layer with a film thickness of 75 nm to 200 nm. And a film thickness of the iridium film is set to be a film thickness of approximately 50 nm.

Note that the iridium oxide film can be substituted for an oxide film of any one of platinum, ruthenium, rhodium, rhenium, osmium, and palladium. In addition, the iridium film can be substituted for a platinum film or a $SrRuO_3$ film.

It is followed by cleansing and removing PZT which is adhered to the back side of a silicon substrate 10 when the ferroelectric film 65 is formed.

Subsequently, as illustrated in FIG. 12H, the sputtering method is carried out to form a titanium nitride film on the second conductive film 66. The titanium nitride film serves as a first hard mask 71.

The first hard mask 71 is not limited to the titanium nitride film. The first hard mask 71 may be formed as a single-layered film formed of any one of a titanium aluminum nitride film, a tantalum aluminum nitride film, and a tantalum nitride film, or it may be formed as a laminated film formed of these films.

Then, the plasma CVD method using a TEOS gas is carried out to form a silicon oxide film as a second hard mask 72 on the first hard mask 71.

Thereafter, as illustrated in FIG. 12I, the first and second hard masks 71 and 72 are patterned to be in island shape in a plan view.

Subsequently, as illustrated in FIG. 12J, the plasma etching is carried out using the mixed gas of HBr, $O_2$, and $C_4F_8$ as an etching gas to dry-etch the films 64 to 66 in portions uncovered with the first and second hard masks 71 and 72.

With this process, the first conductive film 64 and the second conductive film 66 respectively serve as a lower electrode 64a and an upper electrode 66a. And the ferroelectric film 65 serves as a capacitor dielectric film 65a.

The steps described so far result in formation of a ferroelectric capacitor Q provided with the lower electrode 64a, the capacitor dielectric film 65a, and the upper electrode 66a in a cell region of the silicon substrate 10.

Next, description is performed for obtaining a cross sectional structure illustrated in FIG. 12K.

Firstly, the second hard mask 72 is removed by dry-etching or wet-etching.

It is followed by dry-etching and removing the base conductive film 61, the crystalline conductive film 62, and the conductive oxygen barrier film 63 in portions uncovered with the capacitors Q while using the mixed gas of $CF_4$ gas and $O_2$ gas as an etching gas.

Note that the first hard mask left on the capacitor Q is also removed.

Next, as illustrated in FIG. 12L, a RF magnetron sputtering method is carried out to form an amorphous alumina film with a thickness equal to or less than 10 nm to 30 nm, for example, 20 nm, on each of the capacitor Q and the insulating adhesive film 59. The formed alumina film serves as a first protective insulating film 75.

The film-forming conditions for the alumina film are not particularly limited. In the embodiment, an argon gas as a sputtering gas is used with input power of 2.0 kW, and a film-forming pressure of 1.0 Pa. When film-forming is performed for approximately 40 seconds under these conditions, it results in formation of a second protective insulating film 43 with a thickness of approximately 20 nm.

Moreover, in the case of using a single gas of argon as a sputtering gas as described above, there can be obtained an advantage that a film-forming speed for the alumna film can be increased as compared with the case of using the mixed gas of the argon gas and the oxygen gas.

Note that the alumina film is likely to be crystallized in a columnar shape when the film-forming temperature for the alumina film exceeds 350° C.

In case that the alumina film is crystallized as described above, a material such as lead contained in the capacitor dielectric film 65a drains outside along the grain boundary when thermal treatment such as a recovery annealing is carried out on the capacitor dielectric film 65a in a later step. Thus, the ferroelectric characteristics of the capacitor dielectric film 65a are deteriorated.

In addition, it also raises a possibility that the reductant such as hydrogen in the outer atmosphere may intrude into the capacitor dielectric film 65a along the grain boundary to cause the capacitor dielectric film 65a to be reduced and deteriorated.

For this reason, it is preferable that a substrate temperature in the sputtering method be set to be as low as approximately 20° C. to 50° C., for example, at a room temperature to form a dense alumina film in an amorphous state without being crystallized. Furthermore, when the alumina film is formed with the low temperature as described above, there is also obtained the effect that it is possible to suppress occurrence of particles in the sputter chamber, which would be otherwise caused in film-formation at a high temperature.

Moreover, as described in the first embodiment, formation of the alumina film by the sputtering method as described above makes intrusion of the alumina film into the capacitor dielectric film 65a hard as compared with the case of formation of the alumina film by the ALD method. Accordingly, the compositional variation of the capacitor dielectric film 65a can be suppressed to prevent deterioration of the ferroelectric characteristics such as a switching charge of the capacitor dielectric film 65a.

Note that the sputtering method for formation of the first protective insulating film 75 can be substituted for a CVD method. In this case, it is preferable that the film thickness of the first protective insulating film 75 be 1 nm to 3 nm, for example, 2 nm.

Note that the first protective insulating film 75 is not limited to the alumina film. For example, the alumina film as the first protective insulating film 75 can be substituted for any one of titanium oxide film, tantalum oxide film, zirconium oxide film, aluminum nitride film, and aluminum oxynitride film.

Subsequently, as illustrated in FIG. 12M, the recovery annealing is carried out on the capacitor dielectric film 65a in the oxidative gas atmosphere to recover damages caused in the capacitor dielectric film 65a during formation of the first protective insulating film 75.

For the recovery annealing in the embodiment, oxygen as an oxidative gas is used with a substrate temperature of 500° C. to 700° C., for example, 600° C., and an annealing time of 30 minutes to 120 minutes, for example, 60 minutes.

Note that an oxygen density in the annealing atmosphere is, for example, approximately 1% to 100%.

An available oxidative gas for this annealing is ozone or nitrous oxide in addition to oxygen.

Next, as illustrated in FIG. 12N, the ALD method is carried out to form an alumina film as a second protective insulating film 76 on the first protective insulating film 75.

The second protective insulating film 76 formed by the AID method has an excellent coverage characteristic. It enables to form the second protective insulating film 76 with a sufficient thickness on the side surface of the capacitor Q, and to thereby supplement the film thickness of the first protective insulating film 75, which would otherwise tend to be thin on the side surface of the capacitor Q.

As described in the first embodiment, the density of alumina in the first protective insulating film 75 formed by the sputtering method is smaller than that in the second protective insulating film 76 formed by the ALD method.

The film-forming conditions for the AID method are not particularly limited. In the embodiment, the second protective insulating film 76 is formed by repeating approximately 210 cycles each of which corresponds to a set of alternately switching a deposition step of supplying TMA into an unillustrated chamber and an oxidation step of supplying oxygen and ozone into the chamber while a vacuum purge is carried out between the steps.

The deposition step is carried out under conditions with a substrate temperature of 300° C., a gas pressure of 40 Pa, a TMA gas flow rate of 100 sccm, and a deposition time of 5 seconds. The TMA is supplied into the chamber after it is heated to 40° C. and then is evaporated.

The oxidation step is carried out under conditions with a substrate temperature of 300° C., a gas pressure of 133 Pa, and an oxidation time of 15 seconds. A combined gas flow rate of oxygen and ozone is set to 10 slm and a ozone concentration to 200 g/Nm$^3$.

In the embodiment, these conditions are used to form the second protective insulating film 76 with a thickness of 10 nm to 100 nm. The lower limit of the film thickness is set to 10 nm because the reductant prevention capability is decreased by a thickness smaller than 10 nm. On the other hand, the upper limit of the film thickness is set to 100 nm because formation of a hole in the second protective insulating film 76 in a later step is made hard by a thickness larger than 100 nm.

In the above description, the substrate temperatures in the deposition step and the oxidation step are 300° C., respectively. Otherwise, they may be within a range of 200° C. to 350° C.

The lower limit of the substrate temperature is set at 200° C. because the density of the alumina film is decreased by a temperature lower than 200° C. to thereby decrease the reductant prevention capability of the second protective insulating film 76. On the other hand, the reason why the upper limit of the substrate temperature is set to 350° C. is as follows. Specifically, the alumina film is crystallized at a substrate temperature higher than 350° C. Thus, it is likely to cause the intrusion of the reductant such as hydrogen in the outer atmosphere into the capacitor dielectric film 65a along the grain boundary thereof.

Note that the second protective insulating film 76 is not limited to the alumina film. For example, the alumina film as the second protective insulating film 76 can be substituted for any one of a titanium oxide film, tantalum oxide film, zirconium oxide film, aluminum nitride film, and aluminum oxynitride film.

Next, as illustrated in FIG. 12O, the same chamber as used for forming the second protective insulating film 76 as described above is continuously used to anneal the second protective insulating film 76 in the atmosphere containing an oxidative gas without exposing the silicon substrate 10 to the air.

This annealing supplements the oxygen deficiency of the alumina film as the second protective insulating film 76. As a result, the composition of the alumina film comes closer to a stoichiometric composition of $Al_2O_3$ to densify the second protective insulating film 76 and to resolve instability of the alumina film due to the oxygen deficiency.

Furthermore, the annealing evaporates the OH group left in the second protective insulating film 76 formed by the ALD method. Thereby, the deterioration of the capacitor dielectric film 65a due to water coming from the OH group can be suppressed.

In addition, processes from formation of the second protective insulating film 76 to this annealing are carried out without exposing the silicon substrate 10 to the air. Therefore, there is no opportunity for water in the air to adhere to the second protective insulating film 76. Thus, the capacitor dielectric film 65a can be protected from being deteriorated by the water.

The conditions for the annealing are not particularly limited. In the embodiment, the annealing is carried out in the mixed atmosphere of oxygen and ozone. A combined flow rate of oxygen and ozone is set to 10 slm and an ozone concentration to 200 g/Nm$^3$. In addition, a rate of temperature rise is set to approximately 10° C./minute and a substrate temperature is set at 400° C. to 700° C.

The lower limit of the substrate temperature is set at 400° C. because a temperature lower than 400° C. decreases the effect of the densification in the second protective insulating film 76. On the other hand, the upper limit of the substrate temperature is set at 700° C. because a temperature higher than 700° C. crystallizes alumina in the protective insulating films 75 and 76 to thus increase a risk that the reductant intrudes thereinto from the outside along the grain boundary.

Moreover, as described in the first embodiment, only any one of oxygen and ozone may be used as an oxidative gas.

Next, as illustrated in FIG. 12P, annealing is carried out in the atmosphere containing oxygen to further improve the density of the second protective insulating film 76 by evaporating an impurity included therein. The annealing is carried out with a substrate temperature of 500° C. to 600° C. for a processing time of 30 minutes to 90 minutes, for example.

An oxygen density in the annealing atmosphere is, for example, approximately 1% to 100%.

As described in the first embodiment by referring to FIGS. 8A and 8B and FIGS. 9A and 9B, this annealing is carried out at a temperature equal to or lower than 600° C. to prevent the imprint characteristics or fatigue loss of the dielectric capacitor from being deteriorated by the annealing.

Next, description is carried out for obtaining a cross-sectional structure illustrated in FIG. 12Q.

Firstly, the plasma CVD method is carried out to form a silicon oxide film with a thickness of approximately 1500 nm on the second protective insulating film 76. The silicon oxide film serves as a second interlayer insulating film 77. In the plasma CVD method, a mixed gas of a TEOS gas, oxygen gas, and helium gas is used as a film-forming gas, for example.

Thereafter, the CMP method is carried out to polish and planarize the upper surface of the second interlayer insulating film 77.

Subsequently, the second interlayer insulating film 77 is annealed in the atmosphere of $N_2O$ plasmas or $N_2$ plasmas to dehydrate the second interlayer insulating film 77 and nitride the upper surface thereof. Thereby, the water is prevented from re-adhering thereto.

After that, in order to protect the capacitor dielectric film 65a from the reductant such as hydrogen, the sputtering method or the MOCVD method is carried out to form an alumina film with a thickness of approximately 20 nm to 100 nm as a fourth protective insulating film 78 on the second interlayer insulating film 77.

Furthermore, the plasma CVD method using a TEOS gas is carried out to form a silicon oxide film with a thickness of approximately 800 nm to 100 nm on the fourth protective insulating film 78. This silicon oxide film serves as a cap insulating film 79.

Note that the silicon oxide film as a cap insulating film 79 can be substituted for a silicon oxynitride film or silicon nitride film.

Next, as illustrated in FIG. 12R, the insulating films 75 to 79 are patterned to form a second hole 77a in these insulating films above the upper electrode 66a.

After the second hole 77a is formed, the recovery annealing is carried out at a substrate temperature of approximately 450° C. in the atmosphere containing oxygen to recover damages caused in the capacitor dielectric film 65a during the steps so far.

Then, the insulating films 25, 59, and 75 to 79 on the second contact plug 23b are patterned to form a third hole 77b in these insulating films, and thereafter annealing is carried to dehydrate the second interlayer insulating film 77 and the like.

It is followed by forming a second conductive plug 81 and a third conductive plug 82 inside the holes 77a and 77b.

The conductive plugs 81 and 82 are formed in the following manner. The sputtering method is carried out to form a titanium nitride film on each of the inner surfaces of the holes 77a and 77b and the upper surface of the cap insulating film 79. Then, the CVD method is carried out to form a tungsten film on the titanium nitride film, thereby completely embedding these holes 77a and 77b. After that, the CMP method is carried out to remove the excessive titanium nitride film and tungsten film on the cap insulating film 79. These films are left inside the holes 77a and 77b as the conductive plugs 81 and 82.

Note that prior to formation of the conductive plugs 81 and 82, the RF etching using argon plasmas may be carried to remove natural oxide films on the upper surfaces of the upper electrode 66a and the second contact plug 23b which respectively expose from the holes 77a and 77b. With this process, the contact deficiency of the conductive plugs 81 and 82 can be prevented.

Next, as illustrated in FIG. 12S, the sputtering method is carried out to form a metal laminated film on each of the conductive plugs 81 and 82 and the cap insulating film 79. The resultant film is patterned to form a metal wiring 84.

The metal laminated film is formed of a titanium nitride film with a thickness of approximately 50 nm, a copper-containing aluminum film with a thickness of approximately 550 nm, a titanium film with a thickness of approximately 5 nm, and a titanium nitride film with a thickness of approximately 50 nm, which are formed in this order.

The steps described so far complete the basic structure of a semiconductor device according to the embodiment.

According to the present embodiment, as illustrated in FIG. 12L, the first protective insulating film 75 is formed by the sputtering method in which alumina hardly intrudes into the capacitor dielectric film 65a along the grain boundary thereof. Thus, the composition variation of the capacitor dielectric film 65a can be suppressed.

Furthermore, the ALD method is carried out to form the second protective insulating film 76 on the first protective insulating film 75 as illustrated in FIG. 12N, thereby supplementing the film thickness of the first protective insulating film 75 on the side surface of the capacitor dielectric film 65a, which would otherwise tend to be thin in the sputtering method. Accordingly, the reductant such as hydrogen in the outer atmosphere can be prevented from intruding into the capacitor dielectric film 65a from the side thereof to thereby suppress deterioration of the ferroelectric characteristics of the capacitor dielectric film 65a, which would otherwise occur by the reductant.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A method of manufacturing a semiconductor device, comprising:
    forming an insulating film over a semiconductor substrate;
    forming a capacitor over the insulating film, the capacitor including a lower electrode, a capacitor dielectric film including a ferroelectric material, and an upper electrode;
    forming a first protective insulating film over a side surface and an upper surface of the capacitor by a sputtering method; and
    forming a second protective insulating film over the first protective insulating film by an atomic layer deposition method,
    wherein, in the forming of the second protective insulating film, the second protective insulating film is formed in an amorphous state and a temperature of the semiconductor substrate is set within a range of 200° C. or higher and 350° C. or lower.

2. The method of manufacturing a semiconductor device according to claim 1, wherein, in the forming of the first protective insulating film, the first protective insulating film is formed in an amorphous state.

3. The method of manufacturing a semiconductor device according to claim 2, wherein, in the forming of the first protective insulating film, a temperature of the semiconductor substrate is set within a range of 20° C. or higher and 50° C. or lower.

4. The method of manufacturing a semiconductor device according to claim 1, further comprising:
    performing a first annealing on the second protective insulating film in an atmosphere containing an oxidative gas after the forming of the second protective insulating film.

5. The method of manufacturing a semiconductor device according to claim 4, wherein the forming of the second protective insulating film and the performing the first annealing are carried out in a same chamber without exposing the semiconductor substrate to an air.

6. The method of manufacturing a semiconductor device according to claim 4, wherein the oxidative gas is any one of ozone and oxygen.

7. The method of manufacturing a semiconductor device according to claim 4, wherein the first annealing is performed at a temperature of the semiconductor substrate within a range of 400° C. or higher and 700° C. or lower.

8. The method of manufacturing a semiconductor device according to claim 4, further comprising:

performing a second annealing on the second protective insulating film in an atmosphere containing oxygen after the carrying out the first annealing.

9. The method of manufacturing a semiconductor device according to claim 8, wherein the second annealing is performed at a temperature of the semiconductor substrate within a range of 500° C. or higher and 600° C. or lower.

10. The method of manufacturing a semiconductor device according to claim 1, further comprising:
performing a third annealing on the first protective insulating film in an atmosphere containing an oxidative gas after the forming of the first protective insulating film and before the forming of the second protective insulating film.

11. The method of manufacturing a semiconductor device according to claim 10, wherein the third annealing is carried out at a temperature of the semiconductor substrate within a range of 500° C. or higher and 700° C. or lower.

12. The method of manufacturing a semiconductor device according to claim 10, wherein the oxidative gas is any one of ozone, oxygen, and nitrous oxide.

13. The method of manufacturing a semiconductor device according to claim 1, wherein at least one of the first protective insulating film and the second protective insulating film is any of an alumina film, a titanium oxide film, a tantalum oxide film, a zirconium oxide film, an aluminum nitride film, and an aluminum oxynitride film.

14. The method of manufacturing a semiconductor device according to claim 1, further comprising:
forming a third protective insulating film covering the capacitor dielectric film and the upper electrode before the forming of the first protective insulating film, wherein
in the forming of the first protective insulating film, the first protective insulating film is formed over the third protective insulating film.

15. The method of manufacturing a semiconductor device according to claim 1, further comprising:
forming an interlayer insulating film over the second protective insulating film;
planarizing an upper surface of the interlayer insulating film; and
forming a fourth protective insulating film over the interlayer insulating film after the planarizing.

16. The method of manufacturing a semiconductor device according to claim 1, wherein, in the forming of the first protective insulating film, the first protective insulating film is formed so as to be in contact with the side surface of the capacitor.

17. A method of manufacturing a semiconductor device, comprising:
forming an insulating film over a semiconductor substrate;
forming a capacitor over the insulating film, the capacitor including a lower electrode, a capacitor dielectric film including a ferroelectric material, and an upper electrode;
forming a first protective insulating film over a side surface and an upper surface of the capacitor by a sputtering method;
forming a second protective insulating film over the first protective insulating film by an atomic layer deposition method; and
performing a first annealing on the second protective insulating film in an atmosphere containing an oxidative gas after the forming of the second protective insulating film.

18. A method of manufacturing a semiconductor device, comprising:
forming an insulating film over a semiconductor substrate;
forming a capacitor over the insulating film, the capacitor including a lower electrode, a capacitor dielectric film including a ferroelectric material, and an upper electrode;
forming a first protective insulating film covering the capacitor dielectric film and the upper electrode;
forming a second protective insulating film over the first protective insulating film by a sputtering method;
forming a third protective insulating film over the second protective insulating film by an atomic layer deposition method,
wherein, in the forming of the third protective insulating film, the third protective insulating film is formed in an amorphous state and a temperature of the semiconductor substrate is set within a range of 200° C. or higher and 350° C. or lower.

* * * * *